United States Patent [19]
Lanni

[11] Patent Number: 5,949,213
[45] Date of Patent: Sep. 7, 1999

[54] METHOD AND SYSTEM FOR CHARGING RECHARGEABLE BATTERIES

[75] Inventor: Thomas W. Lanni, Laguna Niguel, Calif.

[73] Assignee: Comarco Wireless Technologies, Inc., Irvine, Calif.

[21] Appl. No.: 09/213,018

[22] Filed: Dec. 16, 1998

Related U.S. Application Data

[63] Continuation-in-part of application No. 09/148,811, Sep. 4, 1998, which is a continuation of application No. 08/994,905, Dec. 19, 1997, Pat. No. 5,838,554, which is a continuation-in-part of application No. 08/767,307, Dec. 16, 1996, abandoned, which is a continuation-in-part of application No. 08/567,369, Dec. 4, 1995, Pat. No. 5,636,110, which is a continuation-in-part of application No. 08/233,121, Apr. 26, 1994, Pat. No. 5,479,331

[60] Provisional application No. 60/002,488, Aug. 17, 1995.

[51] Int. Cl.$^6$ ............................................. H02J 72/00
[52] U.S. Cl. ................................. 320/106; 363/144
[58] Field of Search ........................... 320/132, DIG. 4, 320/106; 363/144, 147, 21, 97

[56] References Cited

U.S. PATENT DOCUMENTS

| | | | |
|---|---|---|---|
| 4,912,392 | 3/1990 | Faulkner | 320/44 |
| 5,672,951 | 9/1997 | Shiota | 320/5 |
| 5,739,672 | 4/1998 | Lane | 320/21 |
| 5,739,673 | 4/1998 | Le Van Suu | 320/31 |
| 5,773,961 | 6/1998 | Cameron et al. | 320/132 |
| 5,861,732 | 1/1999 | Takimoto et al. | 320/132 |

OTHER PUBLICATIONS

Data Sheet for Benchmarq Model bq2002C, Fast–Charge IC, Sep., 1997, 8 pages.
Data Sheet for Benchmarq Model bq2954, Lithium Ion Fast–Charge IC, Nov., 1997, 14 pages.

*Primary Examiner*—Adolf Deneke Berhane
*Attorney, Agent, or Firm*—Pillsbury Madison & Sutro LLP

[57] ABSTRACT

A system and method for charging rechargeable batteries is disclosed. A charging circuit monitors aspects of a rechargeable battery during charging and applies power to the terminals of the battery received from a power supply. The charging circuitry signals to a power supply to control the current or voltage applied to the charging circuitry based upon the monitored aspects of the battery and the type of charge storing compound within the cells of the battery. The charging circuitry and battery may be part of a rechargeable battery cartridge disposed within a compartment of a portable electronic device having a dynamic operational load. By controlling the power supply, the charging circuitry can simultaneously apply power to the operational load to operate the device while charging the battery.

18 Claims, 27 Drawing Sheets

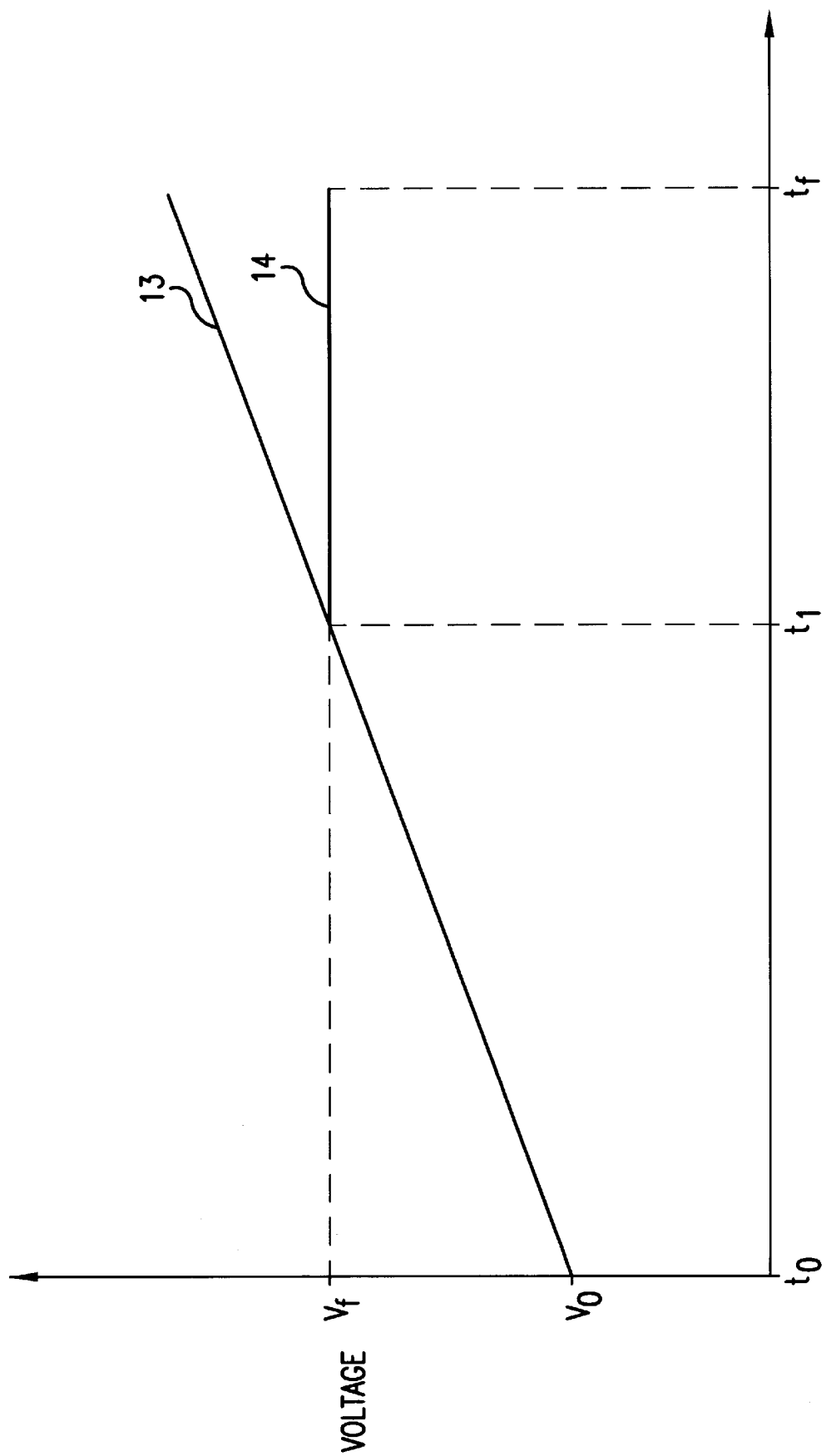

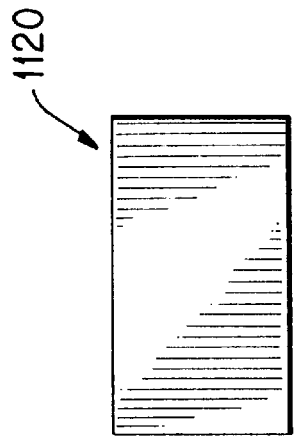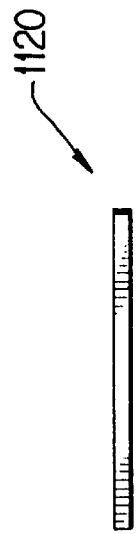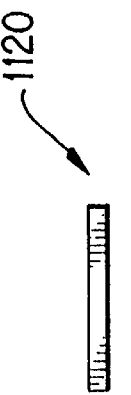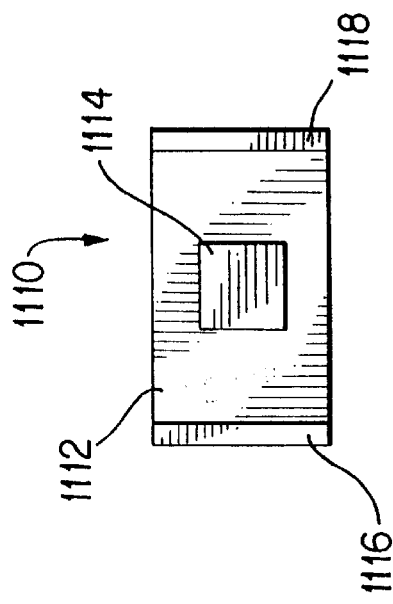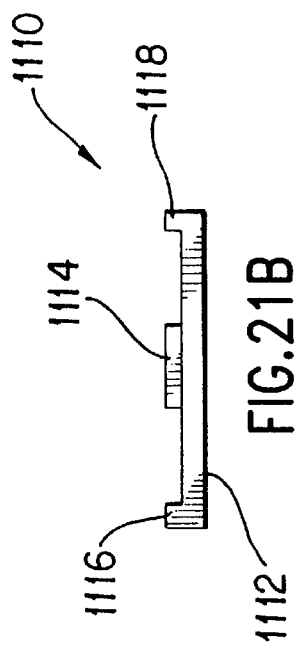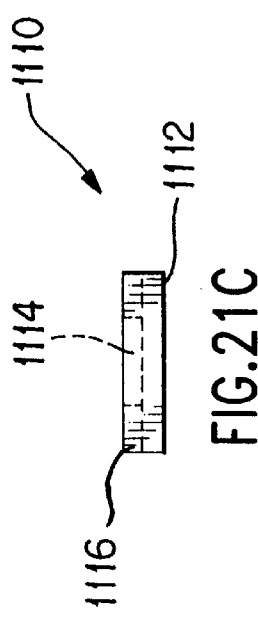

METHOD AND SYSTEM FOR CHARGING RECHARGEABLE BATTERIES

RELATED APPLICATIONS

This application is a continuation-in-part application of utility application 09/148,811 filed on Sep. 4, 1998, which is a continuation of utility application 08/994,905 filed on Dec. 19, 1997, now U.S. Pat. No. 5,838,554, which is a continuation-in-part of utility application 08/767,307 filed Dec. 16, 1996, now abandoned, which is a continuation-in-part application of utility application 08/567,369 filed on Dec. 4, 1995, now U.S. Pat. No. 5,636,110 and claims priority of provisional application Ser. No. 60/002,488 filed on Aug. 17, 1995, and is also a continuation-in-part application of utility application Ser. No. 08/233,121 filed on Apr. 26, 1994, now U.S. Pat. No. 5,479,331 issued Dec. 26, 1995.

NOTICE OF COPYRIGHTS

A portion of the disclosure of this patent document contains material which is subject to copyright protection. The copyright owner has no objection to the facsimile reproduction by anyone of the patent disclosure, as it appears in the United States Patent and Trademark Office patent files or records, but otherwise reserves all copyright rights whatsoever.

BACKGROUND

1. Field of the Invention

Embodiments described herein relate to rechargeable batteries. In particular, the embodiments relate to systems for controlling power supplies to charge rechargeable batteries.

2. Related Art

The miniaturization of electronics was allowed for the proliferation of portable electronic appliances such as mobile telephones, notebook computers, personal digital assistants and the like. These portable devices are commonly powered by batteries which are disposable or rechargeable. Thus, when batteries expire the user must periodically incur either the cost of replacing disposable batteries or the inconvenience of recharging a rechargeable battery.

Charging a rechargeable battery typically requires an external power supply which plugs into a wall socket to provide a DC voltage to terminals of the rechargeable battery while the battery is disposed within the portable system. Fully recharging a battery typically requires one or more hours of contact with the power supply. While many portable systems allow a user to operate the device from either direct power (from the power supply) or from their rechargeable battery, these systems typically do not permit the user to operate the device while a rechargeable battery is charging. Thus, charging the battery typically requires a set period of non-use of the device while the battery receives current from the power supply.

A rechargeable battery typically includes one or more cells in series between positive and negative terminals of the rechargeable battery. Each of the cells typically have a charge storing compound which may be one of many types such as nickel cadmium, nickel hydride or lithium ion compounds. Each of these compounds possess unique charging characteristics. There is a need to optimize the delivery of the power to the rechargeable battery based upon its particular charging characteristics to reduce charging time and reduce the rate of decomposition of the charging compounds disposed within the cells of the rechargeable batteries.

SUMMARY

It is an object of an embodiment of the present invention to provide an improved system and method for charging rechargeable batteries.

It is another object of an embodiment of the present invention to provide a system for providing power to a portable appliance while recharging a battery coupled to the portable appliance.

It is another object of embodiment of the present invention to provide a system and method for providing one of an optimal voltage and an optimal current to charge a rechargeable battery.

It is yet another object of an embodiment of the present invention to provide a method and system for reducing the time required to recharge a rechargeable battery.

Briefly, embodiments of the present invention are directed to a system and method for charging a rechargeable battery which includes at least one battery cell between positive and negative terminals. A circuit generates a signal to control a power supply to provide one of 1) an optimal battery current; and 2) an optimal battery voltage to the rechargeable battery based upon one of a measured current through the battery and a measured voltage across the battery.

The generated signal may dynamically program an external power supply to provide an optimal current for charging the rechargeable battery based upon the chemical characteristics of the at least one battery cell. This reduces the time for charging the rechargeable battery.

In another embodiment, a rechargeable battery cartridge includes a circuit for generating a signal for controlling an external power supply to provide a level of current sufficient to simultaneously charge the rechargeable battery and power a dynamic operational load in the portable appliance. Thus, the power supply powers the portable appliance while charging the rechargeable battery.

BRIEF DESCRIPTION OF THE FIGURES

A detailed description of embodiments of the invention will be made with reference to the accompanying drawings, wherein like numerals designate corresponding parts in the several figures.

FIG. 5 illustrates the charging characteristics of a typical lithium ion battery.

FIGS. 21A–21C are a top plan view and two side plan views of a transformer core in accordance with an alternative embodiment of the power supply of FIG. 1.

FIGS. 22A–22C are a top plan view and two side plan views of a transformer cap for use with the transformer core shown in FIGS. 21A–21C.

DETAILED DESCRIPTION

Figure 1:
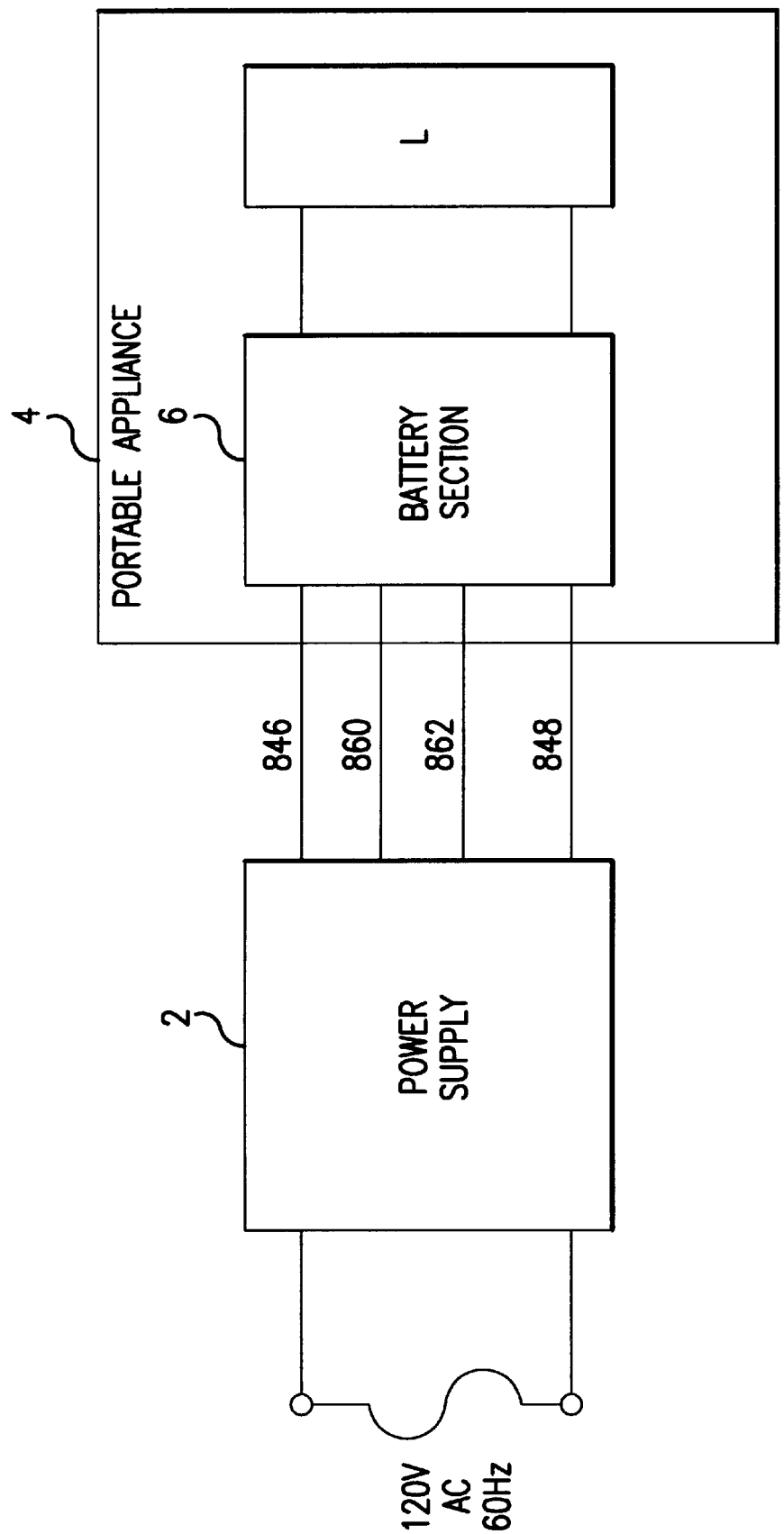
FIG. 1 illustrates an operational environment in which an embodiment of the present invention is to operate.

As shown in the drawings for purposes of illustration, the invention is embodied in an improved system and method for charging rechargeable batteries. Preferred embodiments are used to charge rechargeable batteries in portable electronic appliances such as notebook computers, mobile phones and personal digital assistants. However, it will be recognized that additional embodiments of the invention may be used with other electronic devices, such as computer peripherals, audio and video electronics and the like.

Embodiments of the present invention are directed to a system and method for charging a rechargeable battery by programming a power supply to provide a specific current or voltage in response to measurements of battery characteristics including, for example, battery voltage, current and temperature. Programming signals control a power supply to generate power at either an optimum current or an optimum voltage according to particular charging characteristics of the rechargeable battery. Such a system permits fast charging of the rechargeable battery. Embodiments in which the rechargeable battery and charging circuit are implemented in a portable electronic device, a power supply may simultaneously power an operational load of the portable appliance while providing current to charge the rechargeable battery. The rechargeable battery and recharging circuit may be disposed within a single cartridge which is adapted to be coupled to, or installed in, the portable electronic appliance. Recharging circuitry may be tailored to specific charging characteristics of the rechargeable battery to provide power supply control signals according to a common interface with a programmable power supply.

FIG. 1 shows an embodiment of the present invention in which a battery section 6 is installed in a portable appliance 4 such as a notebook personal computer or mobile telephone. The battery section 6 provides power to an operational load L in the portable appliance 4, and receives power from a power supply 2 on conductors 846 and 848. The power supply 2 receives power from a 120 volt AC source such as a wall socket. According to an embodiment, the battery section 6 provides signals to the power supply 2 on conductors 860 or 862 to control the voltage or current provided on conductors 846 and 848. Circuitry within the battery section 6 monitors the operational characteristics of a rechargeable battery (not shown) and generates signals on conductors 860 and 862 to provide an optimum current or voltage to the rechargeable battery facilitating rapid charging of the battery. As discussed in detail below, if the operational load L is coupled in parallel with the rechargeable battery, the circuitry within the battery section 6 may control the current of the power provided by the power supply 2 to power the operational load L while the rechargeable battery is charging.

Figure 2:
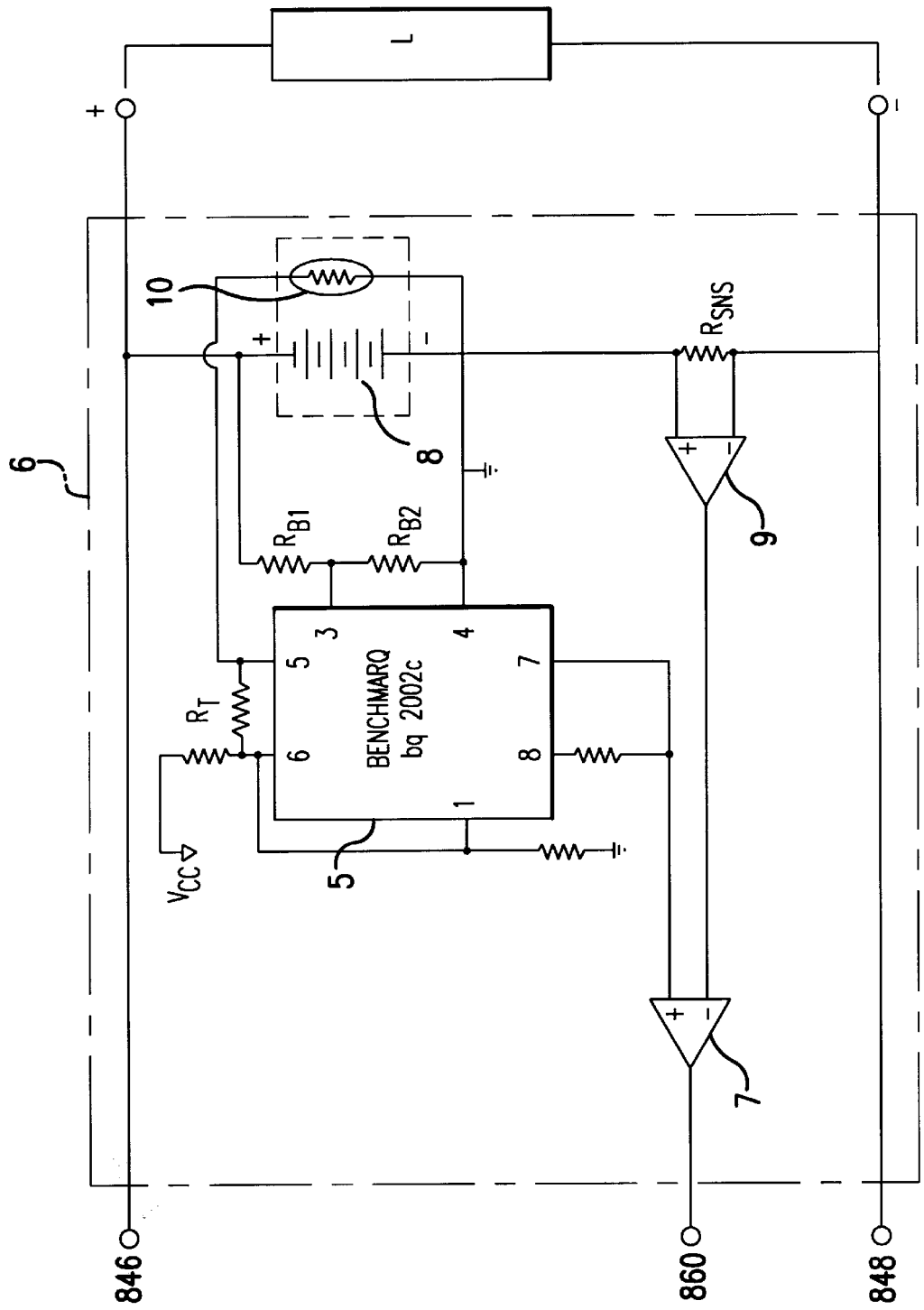
FIG. 2 shows a battery charging circuit according to an embodiment of the present invention suitable for charging nickel cadmium and nickel hydride batteries.

FIG. 2 shows an embodiment of the battery section 6 in which a rechargeable battery 8 is of the nickel cadmium or nickel hydride variety. The rechargeable battery 8 is coupled in series with a resistor $R_{SNS}$ which is coupled between inverting and non inverting inputs of operational amplifier 9. The voltage across the $R_{SNS}$ resistor is substantially proportional to a current through the rechargeable battery 8. The resistance of resistor $R_{SNS}$ is sufficiently small, 25.0 mΩ for example, to minimize resistive losses. The output of operational amplifier 9 provides a signal which is representative of the current in the rechargeable battery 8. An integrated circuit 5 provides an output at P in 8 which is representative of an optimum current in the rechargeable battery 8 which is based upon, for example, a temperature of the voltage across the rechargeable battery 8. Operational amplifier 7 receives at its inputs the signal from pin 8 of the integrated circuit 5 representative of the optimum current applied to the rechargeable battery 8 and the output of operational amplifier 9 which is representative of the actual current in the rechargeable battery 8. Thus the output of the operational amplifier 7 provides a signal which is representative of difference between the optimal and actual currents in the rechargeable battery 8. Conductor 860 provides this signal to an input terminal of the power supply 2 (FIG. 1) to either increase or decrease the current provided on conductor 846.

The power supply 2, battery 8, and operational amplifier 7 are part of a control loop which maintains a level of current sufficient to power the operational load L and recharge the battery 8. The current measured at $R_{SNS}$ is isolated from the current in the operational load L. This enables the output of operational amplifier 7 to control the power supply 2 to change its output current based upon the current in the battery 8.

The integrated circuit 5 which generates the signal representative of the optimal current in the rechargeable battery 8 is preferably tailored to monitor the characteristics of a nickel cadmium or nickel hydride type rechargeable battery. Integrated circuit 5 may be a bq2002c integrated circuit sold by Benchmarq. A voltage divider formed by resistors RB1 and RB2 provide a voltage to pin 3 of the integrated circuit 5 which is representative of a voltage across the rechargeable battery 8. The rechargeable battery 8 may include one or more cells coupled in series. Accordingly, the resistances of RB1 and RB2 are selected to scale the voltage at the pin 3 based upon the fully charged voltage across all cells of the rechargeable battery 8. A thermistor 10 also provides a voltage to pin 5 which is representative of the temperature of the rechargeable battery 8. Based upon the voltages received at pins 3 and 5, the integrated circuit 5 determines the optimal current through the rechargeable battery 8 according to algorithms known to those of ordinary skill in the art and described in the data sheet of the Benchmarq bq2002c integrated circuit.

The operational load L coupled in parallel with the rechargeable battery 8 may not be constant and vary over time depending upon the particular operational state of the portable appliance 4 (FIG. 1). Nevertheless, under the control of the feedback signal of the output of the operational amplifier 7, the power supply 2 may apply current at conductor 846 to be provided to the positive terminal of the rechargeable battery 8 for charging while powering the operational load L. As the current into the load L increases, the current through the rechargeable battery 8 decreases. Such a decrease in the current through the rechargeable battery 8 provides a corresponding decrease in the voltage at the output of operational amplifier 9. While the signal representative of the optimal current at the non-inverting input of operational amplifier 7 remains constant, the output voltage of the operational amplifier 7 at conductor 860 increases, signaling to the power supply 2 to increase the current to the conductor 846. The circuit shown in FIG. 2 similarly reacts to decreases in current drawn from the load L which causes the voltage of the output of operational amplifier 7 to decrease, signaling to the power supply 2 to decrease the current supply to the conductor 846. Thus, the circuit shown in FIG. 2 permits the power supply to simultaneously power the operational load L of the portable appliance 4 while providing current to charge the rechargeable battery 8.

Figure 3:
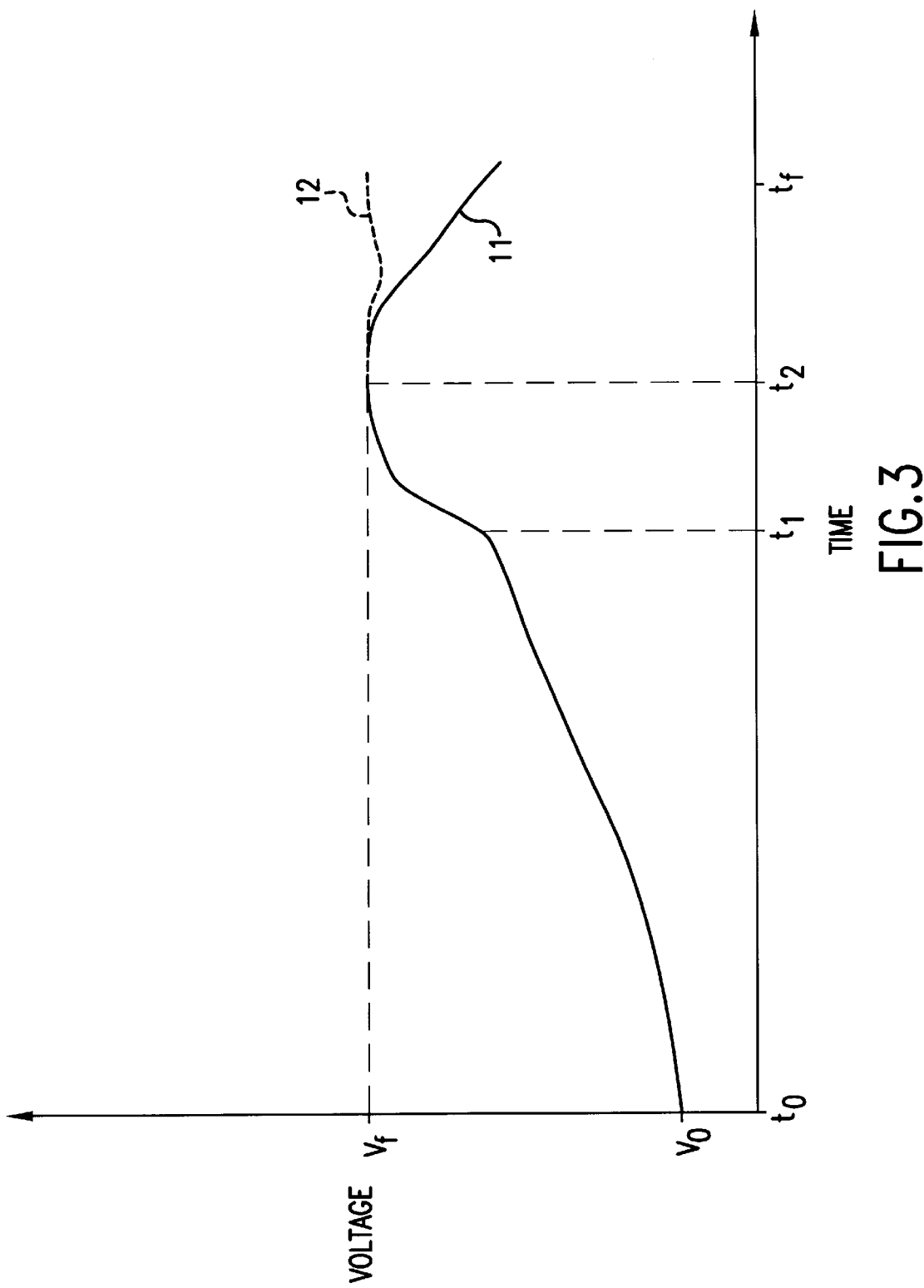
FIG. 3 illustrates the charging characteristics of a typical nickel cadmium or nickel hydride battery.

FIG. 3 shows a voltage versus time profile for a nickel cadmium or nickel hydride rechargeable battery according to an embodiment of the present invention. From time $t_0$ through $t_1$, the battery charges at a rapid rate with the power supply 2 providing a high constant current to the rechargeable battery to increase the voltage across the battery 8 above $v_0$. Between times $t_1$ and $t_2$, the voltage of the rechargeable battery increases at a faster rate until the voltage begins to peak at about $v_f$ at time $t_2$. If the power supply continues to provide current to the rechargeable battery at the same rate, the voltage begins to decrease rapidly as shown in portion 11 of the curve. In an embodiment of the present invention according to FIG. 2, however, the peak of the curve at time $t_2$ is detected so that current may be reduced. This allows the battery to continue charging at about or slightly below the peak voltage $v_f$ until the battery is completely charged at time $t_f$ as shown in portion 12 of the voltage curve. Integrated circuit 5, as discussed above with reference to FIG. 2, measures a voltage across the rechargeable battery 8 and the temperature of rechargeable battery 8 to provide control signals at conductor 860 to program the power supply 2 to reduce the level of current.

The difference between $v_0$ and $v_f$ is preferably significantly less than the total voltage across the rechargeable battery 8. According to an embodiment, the operational load L of the appliance 4 may function at any voltage between $v_0$ and $v_f$. Therefore, with the operational load L coupled in parallel with the rechargeable battery 8, the power supply 2 can provide sufficient current to power the operational load L while providing the optimum current to charge the rechargeable battery 8. This eliminates the requirement for non-use of the portable appliance 4 while the rechargeable battery 8 is charging.

Figure 4:
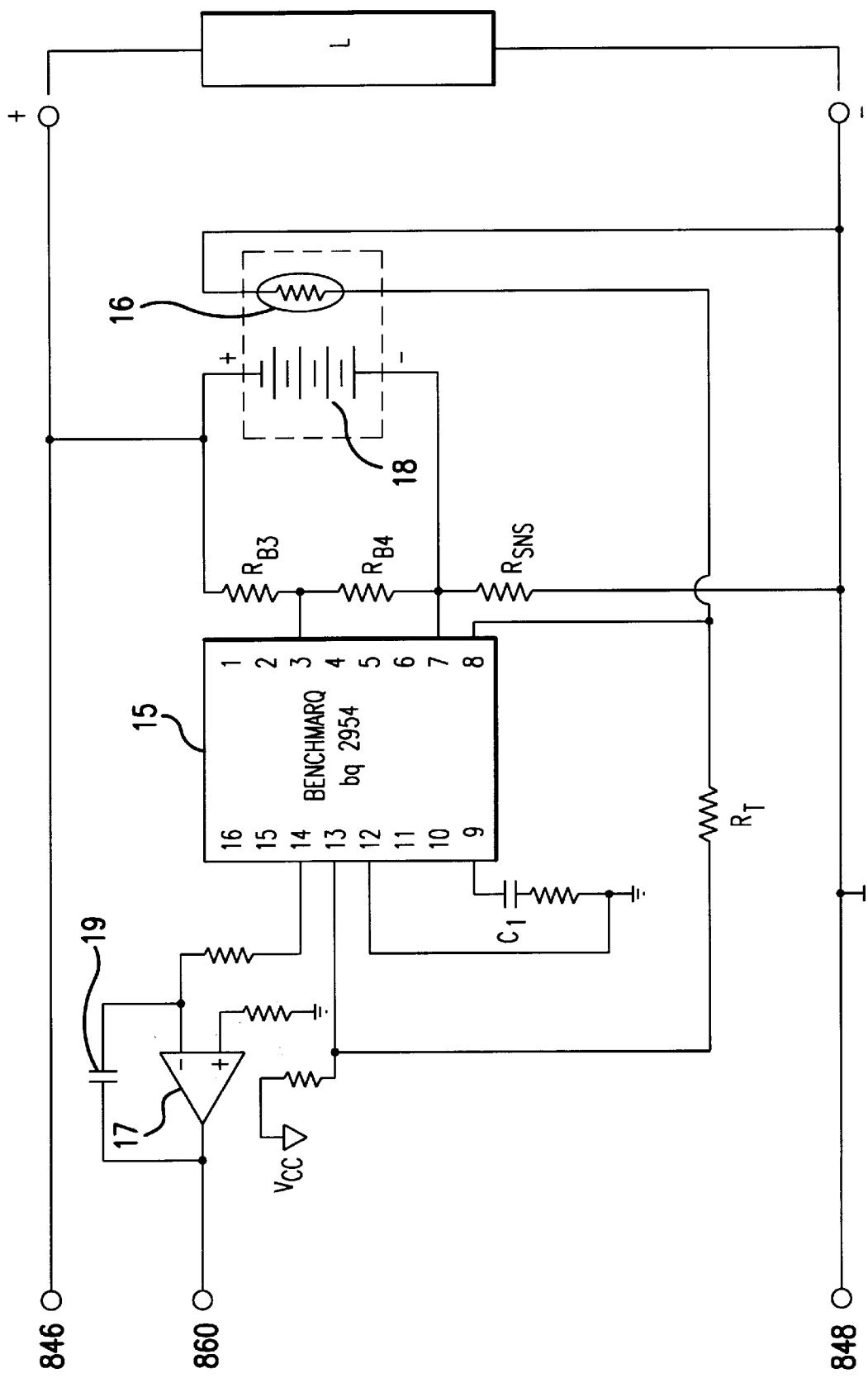
FIG. 4 shows a battery charging circuit according to an embodiment of the present invention suitable for charging lithium ion batteries.

FIG. 4 shows an embodiment of the battery section 6 in which a rechargeable battery 18 is of the lithium ion variety. An integrated circuit 15 such as the bq2954 integrated circuit sold by Benchmarq provides a pulse width modulation (PWM) signal at pin 14 to control the current provided at the terminals of the battery 18 based upon measurements of a voltage across the battery 18 and a current through the battery 18. Resistors $R_{b3}$ and $R_{b4}$ provide a voltage divider across the battery 18 providing a voltage measurement to pin 3 of the integrated circuit 15 which is proportional to the voltage across the battery 18. As the battery 18 may include any number of cells, the resistances of $R_{b3}$ and $R_{b4}$ are selected to properly scale the voltage at pin 3. The resistances of $R_{b3}$ and $R_{b4}$ are sufficiently high so that the current across the resistor $R_{SNS}$ is essentially that of the current through the battery 18. Pin 7 of the integrated circuit 15 receives the voltage across the resistor $R_{SNS}$ which is about proportional to the current through the battery 18. Based upon the measurements of the voltage across the battery 18 and the current through battery 18, the integrated circuit 15 determines a duty factor for the PWM signal outputted from pin 14 of integrated circuit 15. Changes in the duty factor effect changes in the rate of charge applied to conductor 846. The PWM signal is received at an inverting input of an operational amplifier 17. The operational amplifier 17 forms an integration circuit with a capacitor 19. The output of the operational amplifier 17 is therefore an integration of the PWM signal provided at pin 14 of the integrated circuit 15. Thus, the duty factor of the PWM signal determines the voltage at the output of operational amplifier 17.

The integrated circuit 15 may determine such a duty factor using an algorithm known to those of ordinary skill in the art and described in the data sheet of the bq2954 integrated circuit sold by Benchmarq. According to an embodiment, charging takes place according to a 2-phase fast charge algorithm. In the first phase, the integrated circuit 15 regulates constant current to apply a maximum current to the battery 18 until the voltage measured across the battery meets a final voltage level. The integrated circuit 15 then transitions to a second phase which regulates constant voltage (i.e., the final voltage) until the charging current falls below a programed threshold. Charging is then complete.

The output at pin 14 of the integrated circuit 15 is a PWM signal having a duty factor between 0 and 80%. This duty factor is adjusted based upon the voltage received at pin 7 of the integrated circuit 15 (which is representative of the current through the battery 18) and a voltage at pin 3 of the integrated circuit 15 (which is representative of the voltage across the battery 18). Based upon the measured voltage across the battery 18, the algorithm embedded in the integrated circuit 15 determines an optimal current through the battery 18. Thus, depending upon the voltages at pins 3 and 7 of the integrated circuit 15, the integrated circuit 15 may increase the duty factor of the pulse signal at pin 14 to increase the rate of charge applied at conductor 846 or decrease the duty factor of the pulse signal at pin 14 to decrease the rate of charge applied to the conductor 846.

The embodiment shown in FIG. 4 is also capable of providing power to the dynamic operational load L while current is provided to the battery 18. It is understood that prior to charging, the battery 18 provides a voltage lower than the maximum voltage but sufficient to power the operational load L. Thus, the difference between the voltage across the battery 18 when its in its fully charged state and depleted state is small compared with the voltage across the battery 18 in the fully charged state.

As the dynamic operational load L draws an increasing current, this is reflected as a decrease of the voltage across the resistor $R_{SNS}$ detected at pin 7 of the integrated circuit 15. This will cause the integrated circuit 15 to raise the duty factor of the pulse signal provided at pin 14 to increase a level of charge provided at conductor 846. When the operational load L draws less current, this is detected as an increase in the voltage across the resistor $R_{SNS}$, causing the integrated circuit 15 to lower the duty factor of the pulse signal provided at pin 14. This causes a decrease in the level of charge provided by the power supply to the conductor 846. Thus, as in the embodiment described with reference to FIGS. 2 and 3, the embodiment shown in FIG. 4 monitors the current through the battery 18 to provide an optimal level of current to the battery 18 for charging while simultaneously powering the dynamic operational load L.

In this embodiment, the integrated circuit 15 monitors the temperature of the battery 18 and will cut off charging if the temperature exceeds the threshold. If thermistor 16 is coupled to the battery 18 to provide a voltage to pin 8 of the integrated circuit 15 which is representative of the temperature of the battery 18. This threshold temperature can be adjusted by selection of a resistor $R_T$. This temperature sensing feature can also be disabled by providing $R_T$ as a 10KΩ resistor.

FIG. 5 shows a voltage versus time plot representative of the charging characteristics of a lithium ion battery according to an embodiment of the present invention as shown in FIG. 4. From $t_0$ to $t_1$, the battery is charged with a constant maximum current and a voltage across the battery steadily rises from $v_0$. If the constant current is applied after the battery voltage reaches the voltage $v_f$, the voltage will continue to rise as shown in the portion 13 of the voltage plot. However, the battery reaches saturation at $v_f$. According to the embodiment shown in FIG. 4, the integrated circuit 15 detects when the voltage across the battery 18 reaches $v_f$ and then begins to reduce the current which is provided to the battery 18 by decreasing the duty factor of the PWM signal. This maintains the battery voltage at $v_f$ while the current is gradually reduced over time. When the power supply 2 eventually stops providing current to the battery 18, charging is complete. As discussed above with reference to the embodiment shown at FIG. 4, the integrated circuit 15 detects the voltage across the battery 18 and begins sending control signals to the power supply 2 on the conductor 860 to maintain the voltage at $v_f$. In response, the power supply 2 gradually reduces the current provided at conductor 846 to maintain the voltage $v_f$.

The difference between $v_0$ and $v_f$, is preferably significantly less than the total voltage across the rechargeable battery 18 and any voltage between $v_0$ and $v_f$ is sufficient to power the operational load L. Therefore, with the operational load L coupled in parallel with the rechargeable battery 8, the power supply 2 can provide sufficient current to power the operational load L while providing the optimum current to the rechargeable battery 18 (while maintaining the voltage across the rechargeable battery 18 at or below $v_f$). This eliminates the requirement for non-use of the portable appliance 4 while the rechargeable battery 18 is charging.

Figure 6A:
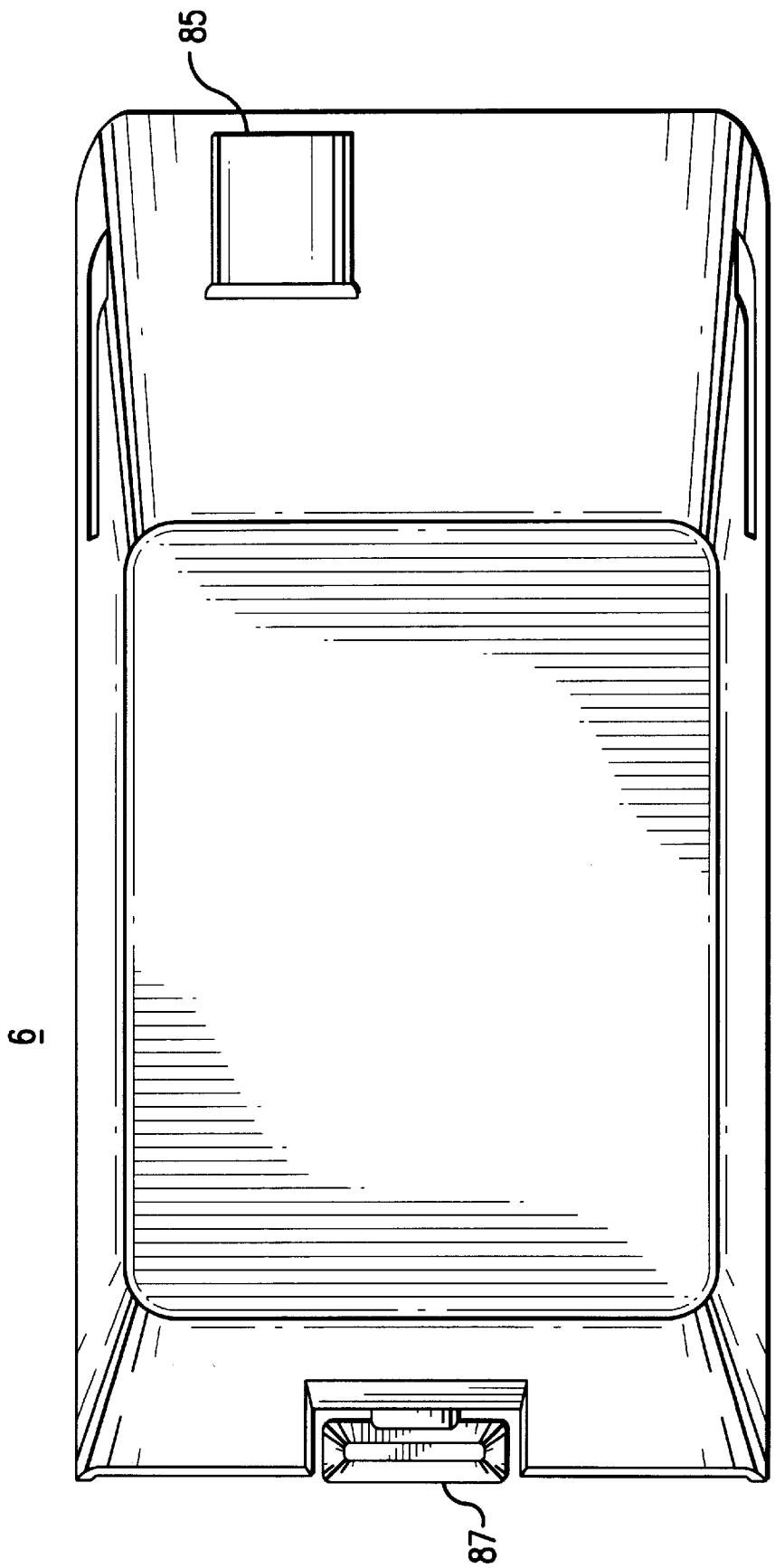
FIGS. 6A and 6B plan and side views show an embodiment of a rechargeable battery cartridge adapted to be coupled to a portable electronic appliance.
Figure 6B:
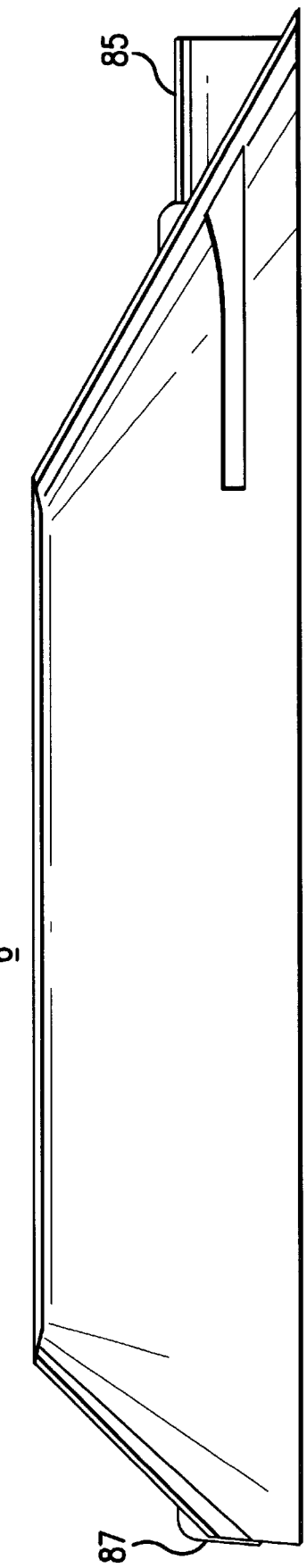

FIGS. 6A and 6B show respective plan and side views of an embodiment of the exterior portions of battery section 6 shown in FIGS. 1, 2 and 4. The battery section 6 may be secured to the portable appliance (not shown) such that a connector 87 rates with the load L (FIGS. 1, 2 and 4). A connector 85 is adapted to mate with a cable for connecting the battery section 6 to the power supply 2 (FIG. 1). Thus, the connector 85 includes conductors for mating with conductors 846, 848, 860 and 862 leading to the power supply 2. Once the battery section 6 is secured to the portable appliance, the connector 85 can receive power from the power supply 2 to recharge a rechargeable battery or power the operational load L.

FIGS. 7 through 26 illustrate various embodiments of the power supply 2 (FIG. 1) which is programmable to provide power at a set current or a set voltage in response to signals received on conductors 860 and 862. Further embodiments of the power supply 2 are described in U.S. Pat. No. 5,838,554 with reference to FIGS. 5A, 5B, 5C, 6 and 42 through 50 therein, incorporated herein by reference. It is understood that the above described system and method for charging a rechargeable battery is applicable to power supplies of other designs which permit dynamic programmability to provide power at a controlled current or a controlled voltage.

Figure 7:
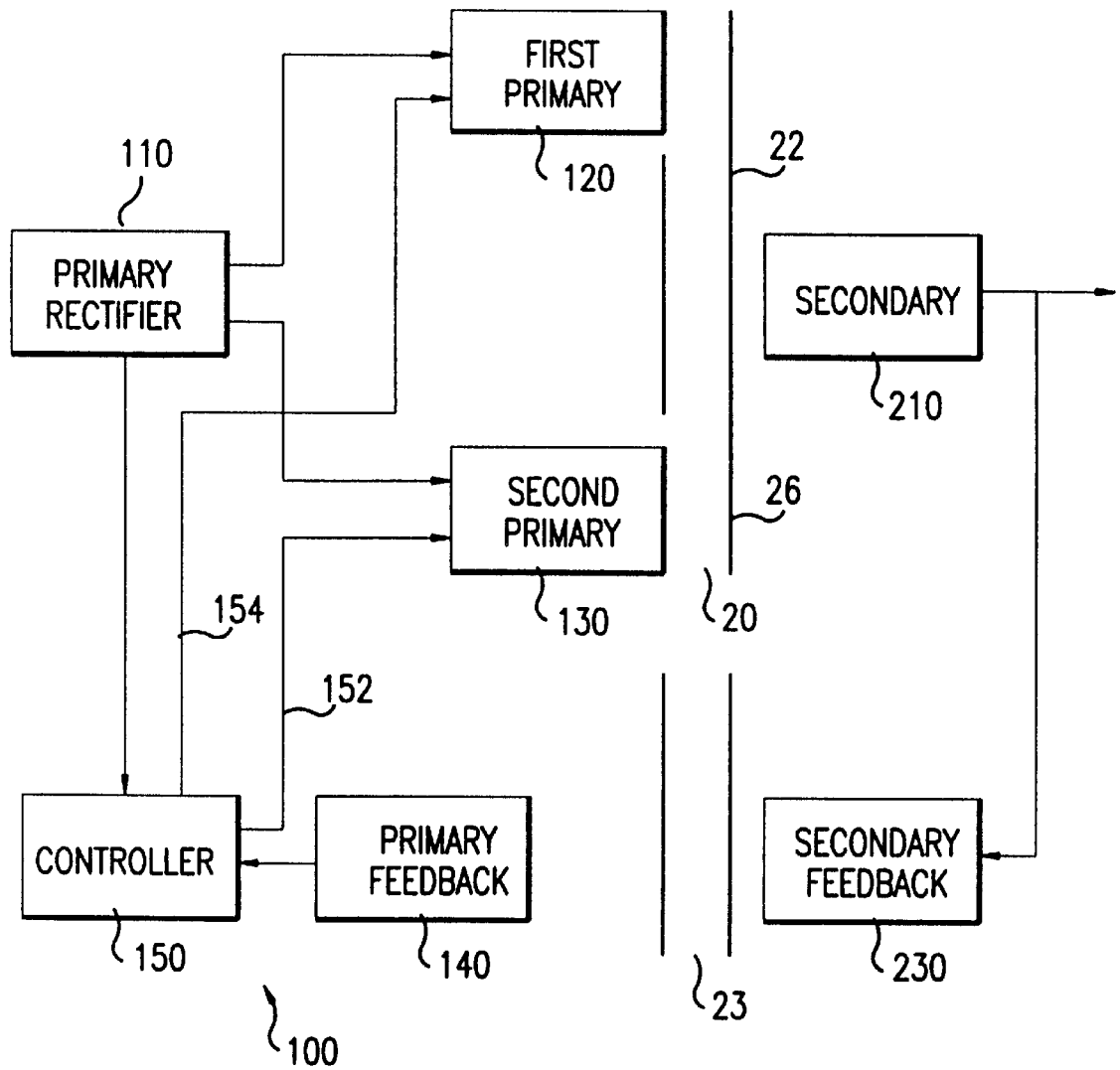
FIG. 7 is a block diagram illustrating an embodiment of the power supply shown in FIG. 1.

FIG. 7 shows a block diagram an embodiment of the power supply 2. All components on the left side of a magnetic core 20 are part of a primary portion 100 and all portions on the right hand side are part of a secondary portion 200 of the power supply 2. The primary portion 100 includes a primary rectifier and input circuit 110, a first primary and drive circuit 120, a second primary and drive circuit 130, a primary feedback circuit 140 and a controller 150. The secondary portion 200 includes a secondary output circuit 210 and a secondary feedback circuit 240.

The function of the primary rectifier and input circuit 110 is to couple the embodiment 10 to the line voltage (for example 120 volt, 60 Hz), to rectify that voltage and provide DC power for the remainder of the primary portion 100 and a ground path for the primary circuits 120 and 130. The controller 150, which may be a Unitrode 3875 of integrated circuit which provides two square wave driver signals 152 and 154 having alterable phases to the first and the second primary circuits 120 and 130. The first and second primary circuits are resonant circuits that are resonant at about the frequency of the driver signals and include coils that are coupled to the core 20, which may be a planar or low profile "E" type core, which may be any low loss material, as is shown in a sectional view in FIG. 8. Hence, the driver signals are magnetically coupled to the core 20 by first and second primary coils contained within the circuits 120, 130.

Figure 8:
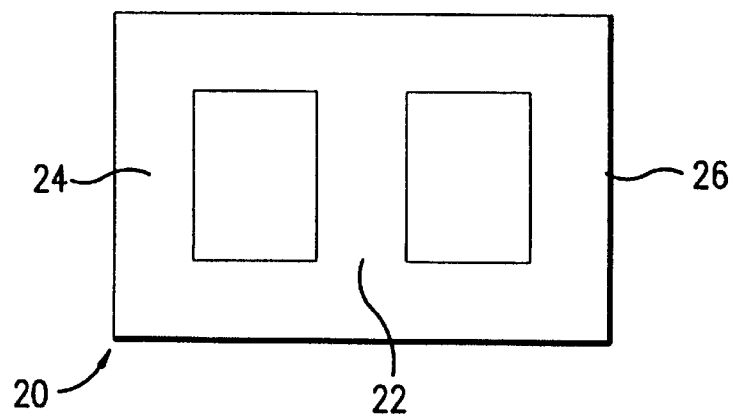
FIG. 8 is a sectional view of the E core for use in an embodiment of the power supply shown in FIG. 7.

The coil 212 in the secondary circuit 210 is preferably positioned relative to the coils of the two primary cores so that the coil in the secondary circuit is at a summing point of the magnetic flux from the primary circuit coils. If a planar or low profile "E" type core as shown in FIG. 8 is used, the coil 212 for the secondary circuit 210 is positioned about the central leg 22. The coil for the feedback circuits 140 is positioned on one of the outer legs 24, 26. As a result, the magnetic flux from the two primary coils of the primary circuits 120, 130 are summed at the position where the secondary coil 212 for the secondary circuit 210 is positioned. (This positioning of the coils is shown in FIG. 7 by using the double line to indicate the central leg 22 and a single line to represent the outer legs 24, 26).

The secondary feedback circuit 230 monitors the amplitudes of the DC voltage and current produced by the secondary circuit 210. Coils positioned on a core 23 magnetically couple the primary feedback circuit 140 and the secondary feedback circuit 230 to provide a feedback signal to the controller 150. In response to the feedback signal, the controller alters the relative phase between the two driver signals 152 and 154 to obtain the desired magnitude of the voltage and current. Since the secondary coil 212 is located at a summing point on the core of the flux from the two primary coils, as the phase between the driving signals 152 and 154 to the two primary coils alters, the magnitude of the current and voltage induced in the secondary coil will vary. This will permit control of the secondary circuit 210 output voltage and current, thereby providing a readily controlled output voltage.

Figure 9A:
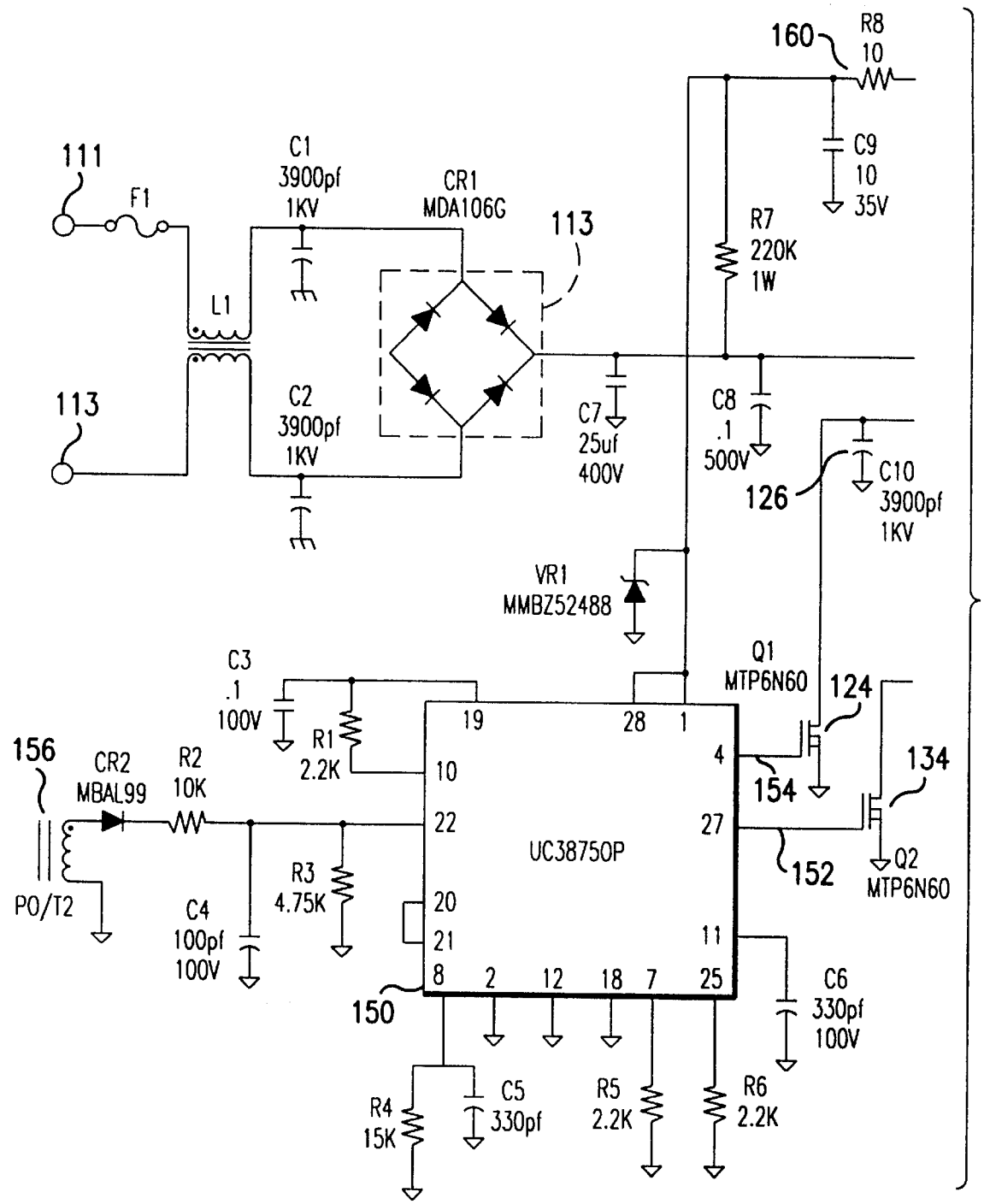
FIGS. 9A and 9B are a detailed circuit schematic of an embodiment of the power supply shown in FIG. 7.
Figure 9B:
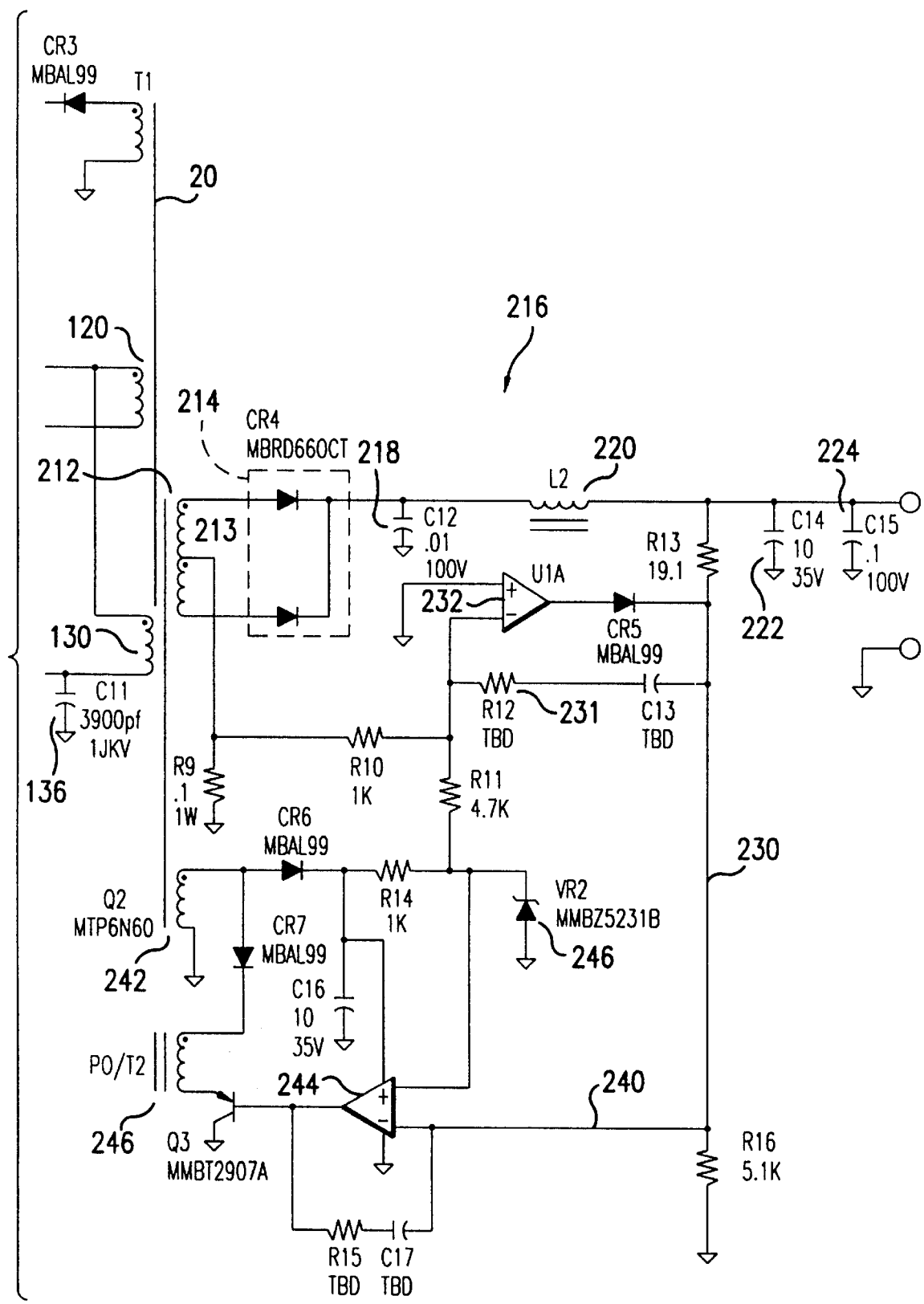
Figure 10:
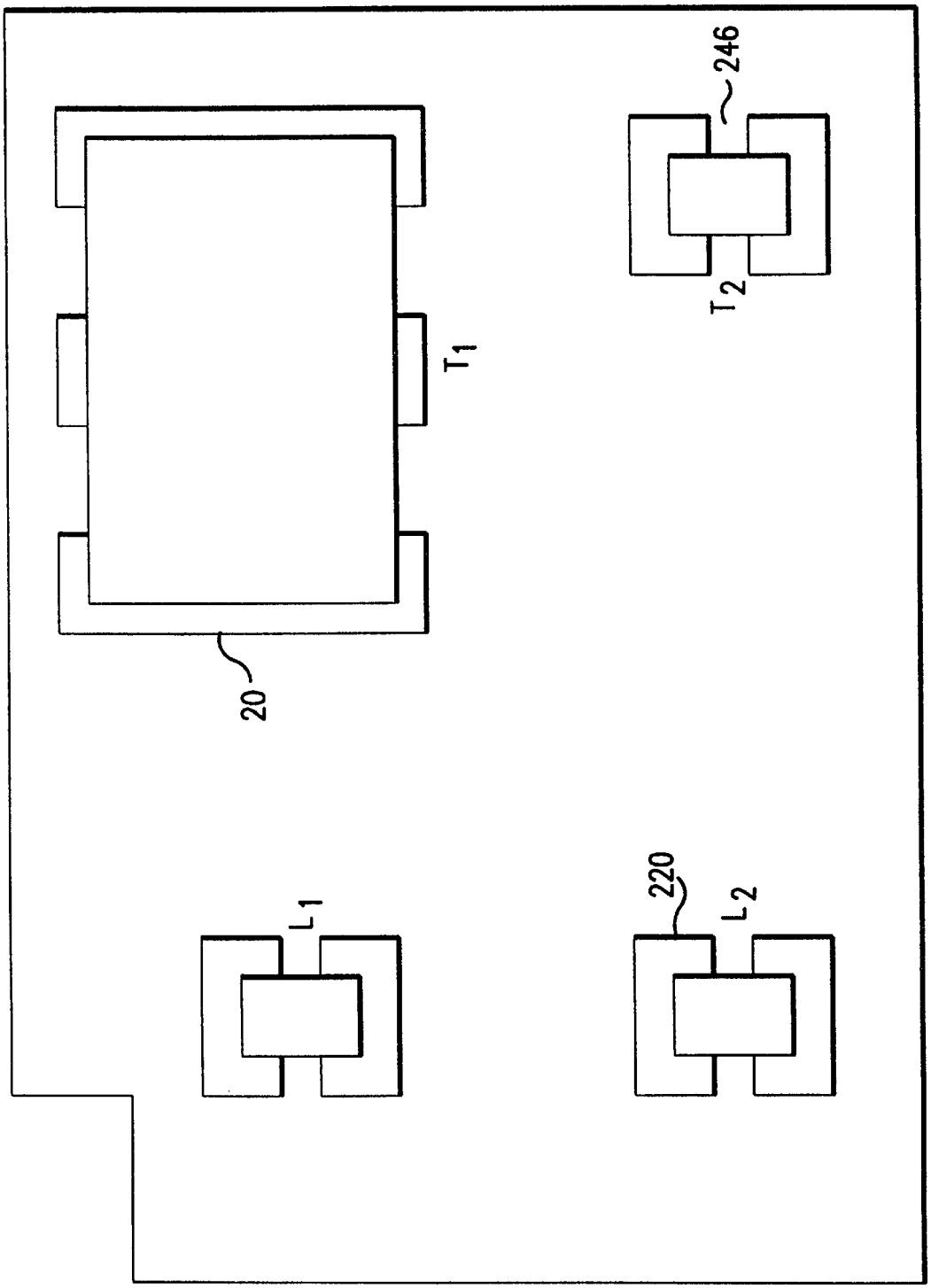
FIG. 10 is a top planar view of a printed circuit board as an embodiment of the circuit of FIG. 9.

FIGS. 9A and 9B show a more detailed schematic of an embodiment of the power supply 2. A standard AC plug may be coupled to input nodes 111, 112 to a first filter coil L1 that is coupled to a full wave rectifier bridge 113, which may be a MDA106G. Filtering capacitors C1, C2, C7, C8 are also coupled to the bridge 113 and one side of the bridge is coupled to AC ground.

The bridge is coupled to the primary coils 122 and 132 of the first and second primary circuits 120, 130 respectively. The other terminal of the primary coils 122, 132 are coupled to the remainder of the primary circuits 120 and 130. Each of these primary circuits 120, 130 also comprise a drive field effect 124, 134, which may be a MTP6N60 and a capacitor 126, 136. The coils 122, 132, transistors 124, 134 and capacitors 126, 136 are selected so that the resonant frequency of the circuits 120, 130 is at about the frequency of the drive signals 152, 154 to maximize the efficiency of the power supply. In this embodiment, the drive signal frequency oscillates at about one megahertz, though other frequencies may be used.

The drive signals 152 and 154 are supplied by a controller 150 such as a Unitrode UC3875QP or other similar product. The controller 150 receives the biasing power at pins 28 and 1 from the primary power supply circuit 160.

Each of the coils 122 and 132 induce a varying magnetic field in the outer legs of the core 20. The secondary coil 212, which has a center tap 213, is coupled to a half wave rectifier bridge 214, which may comprise an MBRD660CT, and then is coupled to a filtering circuit 216 comprised of a capacitor 218, an inductor 220, and capacitors 222 and 224 to provide a DC regulated output 226.

The regulation is provided by feeding back to the controller 150, a signal modulated by a current sensing amplifier circuit 232 and a voltage sensing circuit 240 comprising the feedback circuit 230. To provide the carrier for modulation, a further secondary carrier coil 242 is coupled to one of the outer legs of the core 20. One of the legs of this transformer coil 242 is coupled to an isolation feedback transformer T2.

The current sensing circuit takes the output of the center tap of the secondary coil 212 and provides a voltage drop across resistor R9 that is provided to current sensing amplifier circuit 232. The output of the current sensing amplifier circuit 232 is added to a voltage dropped across R13 and is provided to an amplifier 244 in the voltage sensing circuit 240. The other input in the voltage sensing circuit is a reference voltage developed by the zener reference diode 246 and also provided as a biasing level to the current sensing amplifier circuit 232. The output of the amplifier 244 is provided to the base of bipolar transistor Q3, which may be a MMBT2907T, configured in a common base configuration, to amplitude modulate the current through the secondary side coil 246.

The primary side coil 156 of feedback transformer T2 is magnetically coupled to the secondary side coil of 246 and generates an amplitude modulated signal that is envelope detected and integrated to provide a feedback voltage at input 22 of the controller 150.

As the amplitude of the envelope of the modulated signal increases, the voltage at input 22 of the controller 150 increases. When the controller 150 determines that the voltage has exceeded a predetermined limit, indicating that either the current or voltage at the output has increased beyond the predetermined maximum, the relative phase difference of driver signals 152 and 154 is increased. If the amplitude at input 22 decreases below a predetermined threshold indicating that the voltage or the current is below the desired levels, the relative phase of signals 152 and 154 is decreased towards zero to increase the voltage or current. Due to the summing effect of the magnetic flux at secondary coil 212, a highly efficient control or regulation of the power supply circuit is obtained.

Because of the high efficiency that is attained with this circuit, heat dissipation is much less and it is possible to reduce the size of power supply to a much smaller form factor. In particular, each of the electrical components in FIG. 8, other than the transformer, may be mounted using surface mount devices on a printed circuit board. Further, each of the inductors and transformer cores are low profile or planar cores mounted through cutouts formed in the printed circuit board. The coils of the inductors and transformers are provided by wiring traces on the circuit board that wrap around the portion of the appropriate core penetrating the circuit board. As a result, an extremely compact form factor may be obtained. FIG. 9 shows a top planar view of such a printed circuit board with each inductor L1, L2 and transformer cores T1 and T2 identified.

Notwithstanding the smaller size of the form factor, heat dissipation is not a serious problem due to the increased efficiency of the power supply according to the disclosed embodiments. Therefore, with all of the components assembled on a printed circuit board as described above, the assembled printed circuit board may be housed within a housing formed from an injection molded plastic dimensioned 2.75×4.5×0.436 inches without undue heating of the housing, although other dimensions may be used with a key to maintaining a thin profile of the power supply being the ratio of the surface area of the top and bottom surfaces to the overall thickness of the housing. With proper heat sinks, for example, even smaller dimensions may be attained.

Although the disclosed embodiments show only one regulated DC voltage being supplied (for example +5 or +16 volts DC), it would readily be understood by those of ordinary skill in the field that other regulated or unregulated voltages may also be supplied with minor modifications to the disclosed embodiment. For unregulated voltages, additional secondary coils (not shown) with the appropriate number of windings to provide the voltage may be magnetically coupled to any of the legs of the transformer core 120. The appropriate circuitry must then be provided for rectifying and filtering the output of this additional secondary coil. Similarly, an additional regulated voltage may be supplied by providing a feedback control circuit such as the type described above that provides the appropriate feedback.

Figure 11A:
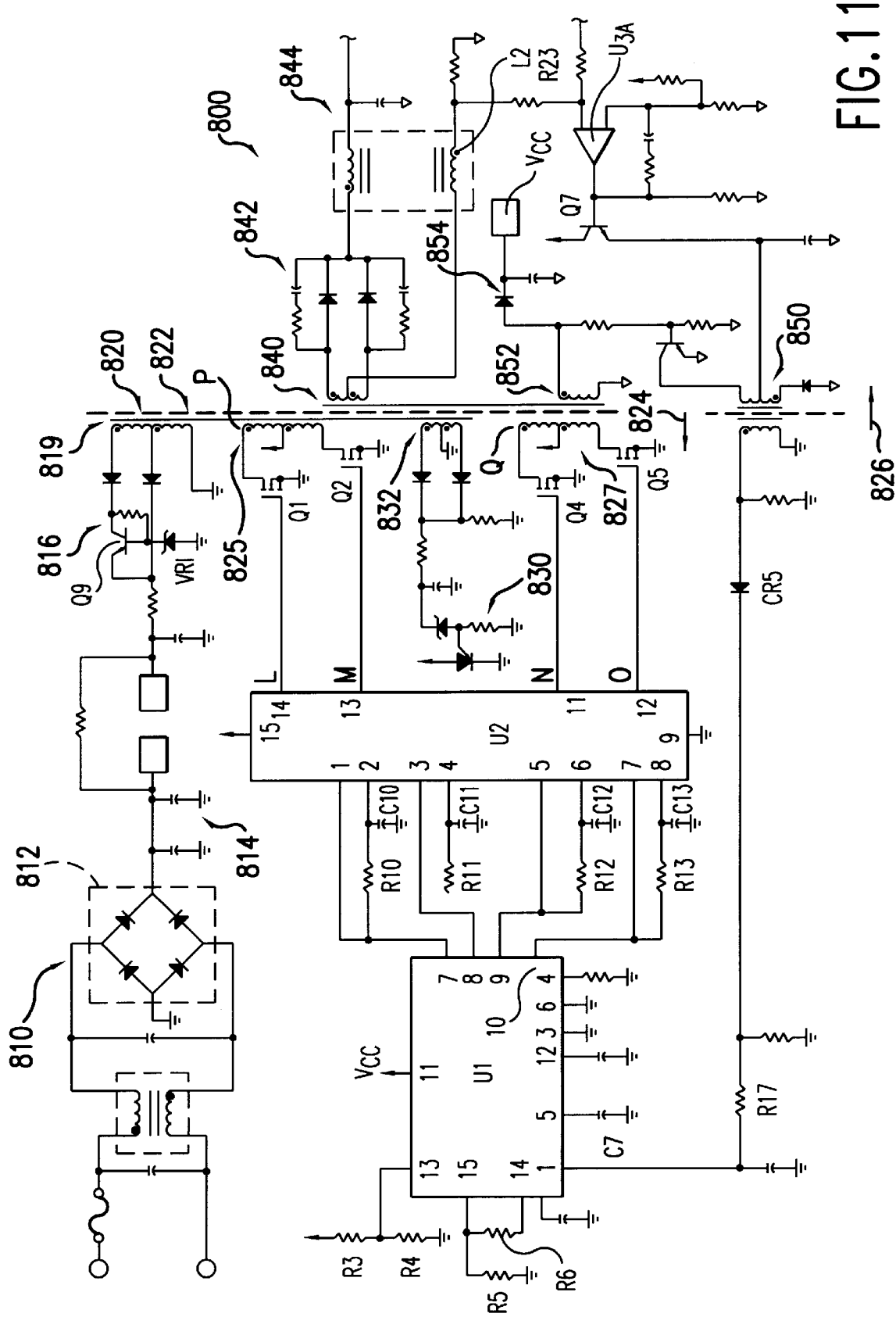
FIGS. 11A, 11B and 11C are a schematic diagram of additional embodiments of the power supply.
Figure 11B:
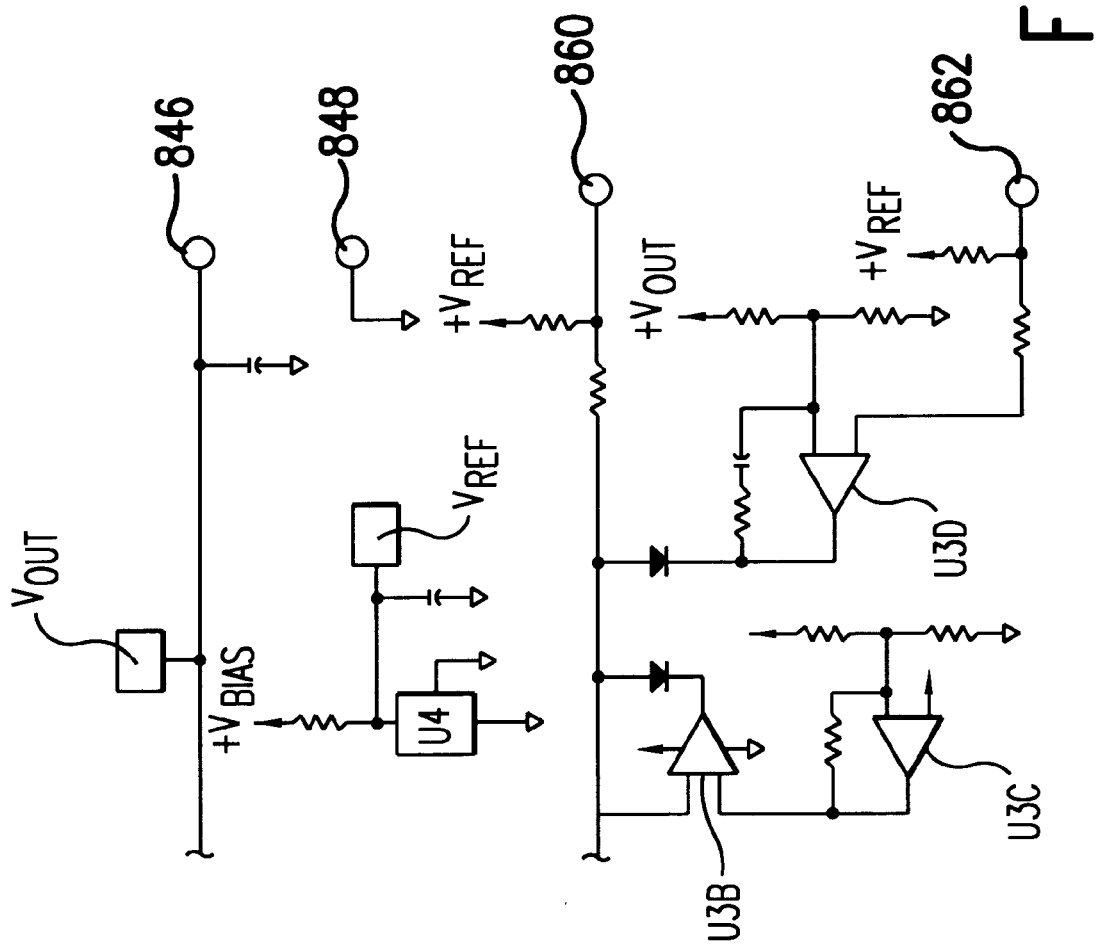

FIGS. 11A and 11B show a schematic for the power supply circuit 800 with all resistance values in ohms and all capacitance values in microfarads unless otherwise labeled. The power supply is formed on a multilayer printed circuit board (not shown) having length and width dimensions that are only slightly smaller than the exterior of the case and fit as precisely as possible within the chamber of the case 300 sandwiched between the heat sinks to minimize movement after assembly. Further, as far as possible, surface mount devices are used to minimize the vertical dimension and all coil cores are preferably planar, low profile cores. Optimally, parts having the smallest possible thickness should be used.

The power supply 800 includes an input circuit 810 that may be coupled to any AC power source preferably having a frequency of between about 50 to 90 hertz and preferably having a voltage of between about 90 to 240 Volts AC. This input circuit 810 may include a full wave bridge rectifier 812, a filter circuit 814 and a regulation circuit 816 to provide an independent power supply for all integrated circuits used on the primary side 824 of the circuit. For filtering purposes, the input regulator circuit 816 may also include a center tapped coil 819 mounted on one of the exterior legs of the "E" planar core 822 of the transformer 820. (Preferably, the planar "E" core of the type shown in FIG. 8 is used.) When the AC input voltage exceeds a predetermined range such as one hundred and forty volts RMS, transistor Q9 in cooperation with zener diode VR1 will cooperate so that the center tap of the coil 819 will be selected. This permits the output Vbias of the regulator to be in an acceptable range for higher input voltages such as may be common outside of the United States. The output Vbias is used for supplying power to all of the internal integrated circuits on the primary side 824 of the transformer 820, namely integrated circuits U1 and U2. This permits these integrated circuits U1, U2 to continue functioning even if the DC output voltage from the power supply 800 drops below the range necessary for the integrated circuits U1 and U2 to continue operating.

A controller integrated circuit U1 provides the four control signals for powering the MOSFETs coupled to the two primary coils 825 and 827 with their center taps coupled to Vbias. The outputs of integrated circuit U1 at pins 7 through 10 provide the control signals to a MOSFET driver circuit U2 such that MOSFETs Q1, Q2, Q4 and Q5 provide the appropriate phase control as is described in connection with FIG. 8. Integrated circuit U2 may be for example a 4468 integrated circuit available from Micrel, Teledyne and Telcom.

Each of power switching MOSFET transistor pairs Q1 and Q2, and Q4 and Q5 are coupled to center tapped primary coils 825 and 827, respectively. These transistors preferably have heat sinks (not shown) coupled to their cases, and/or these heat sinks may also be thermally coupled to one of the heat sinks mounted immediately below and immediately above the top and bottom heat sinks for better thermal control. The capacitance of the MOSFETs Q1, Q2, Q4 and Q5 and the inductance of the coils 825 and 827 are selected to provide resonance at the frequency at which the drive signals are supplied, which may be about 1 MHZ. Nonetheless, other frequencies may be used, for example, between a range of about 500 KHz to 2 MHz.

Figure 11C:
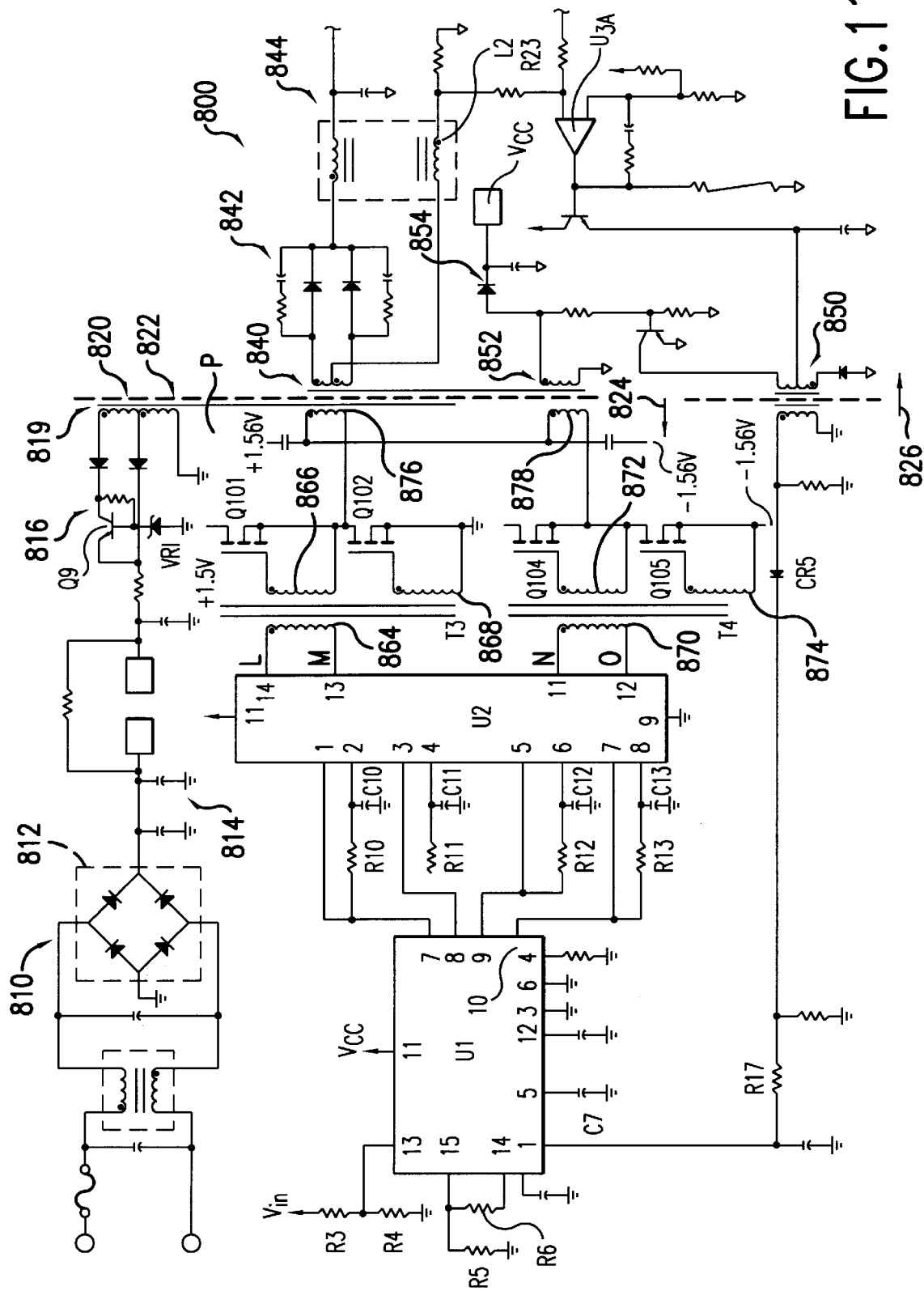

FIG. 11C shows an alternative configuration in which the push pull approach on the primary side 824 of the circuit 800 is replaced with a half-bridge rectifier configuration. In particular, the half-bridge rectifier configuration includes transformers T3 and T4 for transferring power to primary windings 876 and 878 via transistors Q101, Q102, Q104 and Q105. Transformers T3 and T4 act as isolation drivers for the gates of these transistors. In other embodiments, this circuitry could be replaced with a full bridge rectifier circuit with 8 transistors. One of ordinary skill in the art would understand that several other configurations are possible.

Figure 12:
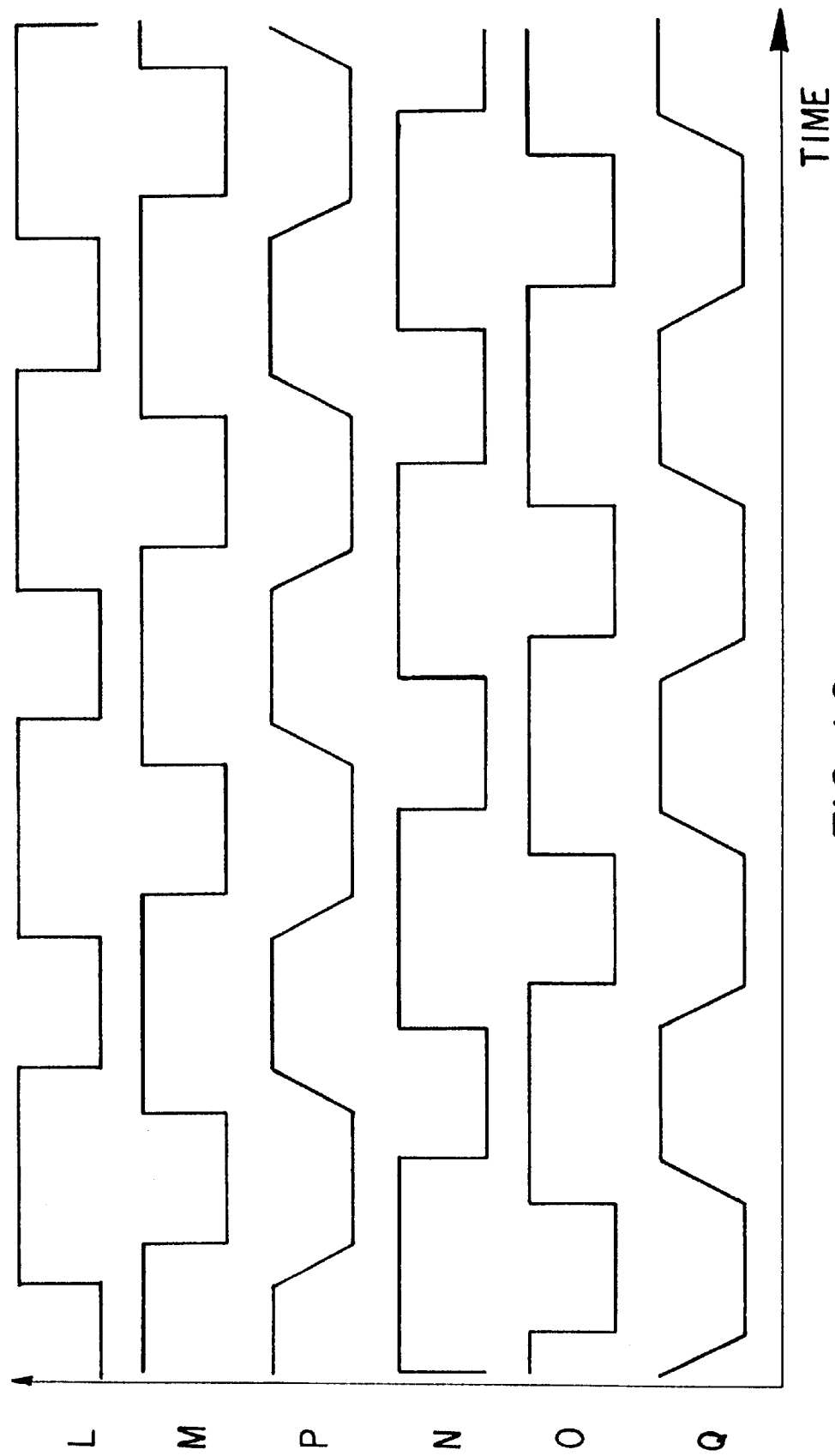
FIG. 12 is a timing diagram for an embodiment of the circuit shown in FIGS. 11A and 11B.

FIG. 12 shows a timing diagram of the signals at nodes L through Q shown on FIG. 11A and 11B. The integrated circuit U1, as described in more detail below, through feedback, provides MOSFET driving signals L through O. The MOSFET driving signals provided to each primary winding, 825 and 827 (i.e., L and M for primary winding 825 and N and O for primary winding 827) are preferably one hundred eighty degrees out of phase as shown in FIG. 12. However, the relative phase relationship of driving signal pair L and M for primary winding 825 with respect to driving signal N and O for primary winding 827 may be changed by the integrated circuit controller U1 in the manner described below to provided the regulated DC output voltage at connectors 846 and 848. Maximum power is provided when the pairs of driving signals are in phase with each other. It should be noted that while the control signal provided at pins 7 through 10 are preferably at substantially a fifty percent duty cycle, the resistors R10 through R13 and the capacitors C10 through C13 combine with the integrated circuit U2 to provide preferably driving pulses L through O with a duty cycle of less than 50 percent. This ensures that the FETS in a pair (i.e., Q1 and Q2 for winding 825 and Q4 and Q5 for winding 827) are never both on at the same time to provide zero resonant switching and reduce power consumption.

Due to the zero volt resonant switching design of the circuit, MOSFET pair Q1 and Q2 are preferably never on at the same time and MOSFET pair Q4 and Q5 are preferably never on at the same time. MOSFET Q1 will turn on just about when the voltage at node P, which is at the drain of transistor Q1, reaches a minimum and will turn off immediately after the voltage at the drain of transistor Q1, goes above that minimum level. Similarly, due to the phase relationship of drive signal pair L and M at nodes L and M, transistor Q2 will only be on when the voltage at the drain is almost at the minimum. Transistor Q4 will also only be on when the voltage at node Q is virtually at its minimum and the transistor Q5 will only be on when the voltage at its drain is nearly at its minimum.

It should be noted that the duty cycle of signals L through O is selected so that the waveforms P and Q are substantially trapezoidal with clipping occurring by transistors Q1, Q2, Q4 and Q5. This permits operation of the circuit over a wider range of input voltages. However, in alternative embodiments, transistors Q1, Q2, Q4 and Q5 need not clip so that the waveshapes at the drains of these transistors are substantially sinusoidal. Alternatively, using a low enough frequency for the drive signals, a square wave on the drains of the actual transistors could be used but would probably require larger cores.

For the secondary side 826 of the power supply circuit 800, a single secondary winding 840 is located at the magnetic summing node of the core 822 (i.e., the center leg of the low profile "E" type core shown in FIG. 8). That secondary winding 840 is coupled to a rectifier circuit 842 and then to an output filter 844 including a filter choke L2 to provide the regulated DC output at connectors 846, 848 in the manner described below.

The center tap of the secondary winding 842 is coupled through a coil in the filter coil L2 sharing a common core with the coil in the output filter 844. Through resistor R23, this center tap of winding 842 provides a current sense input to a summing amplifier U3A. A voltage sense of the output DC regulated voltage Vout is provided to an amplifier including amplifier U3C.

The sensed voltage signal at the output of amplifier U3C is provided to the summing amplifier U3A through amplifier circuit U3B to provide the feedback necessary for the desired regulation of the DC output.

The output of the summing amplifier U3A is provided through an emitter follower transistor Q7 to the center tap of the secondary side 826 of the feedback transformer 850. This transformer is magnetically isolated from the transformer 820. The signal at the center tap of transformer 850 amplitude modulates a carrier signal provided by winding 852 provided on the same exterior leg of the core 822 as primary winding 827. Preferably also, this should be the opposite exterior leg of the core 822 on which coil 819 and winding 825 are mounted.

The primary side 824 coil of transformer 850 provides an amplitude modulated feedback signal that has an amplitude envelope. A diode detector comprised of diode CR5 and resistor R17 strip the carrier away, leaving the amplitude envelope as a feedback control signal to the VMOD input (pin 1 of U1) to provide the feedback useful for altering of the phase relationship between the drive signal pairs of signals L and M on the one hand, and signals N and O, on the other hand to regulate the DC power supply output at connectors 846, 848.

With the current control connector 860 and the voltage control connector 862 left unconnected (as shown), amplifiers comprising U3B and U3D along with the current and voltage sense signals cause the integrated circuit U1 to control the phase relationship between the drive signal pairs L and M, on the one hand, and N and O, on the other hand, to provide a constant power supply until the output voltage drops below about ten volts. Then, due to the feedback signal at pin 1 of the controller U1, the integrated circuit controller U1 controls the relative phase relationship between the pair of drive signals L and M, on the one hand, and N and O, on the other hand, to provide a constant current source down to a minimal voltage, which is preferably less than about one volt.

It should also be noted that the Vcc used by the amplifiers U3A through U3D in the integrated circuit U3 and the voltage regulator U4 to generate the +5 volts used in the control circuit (e.g. comprising amplifiers U3B, U3C and U3D) is supplied by a rectifier circuit 854. The rectifier circuit 854 is also coupled to secondary coil 852.

Figure 13:
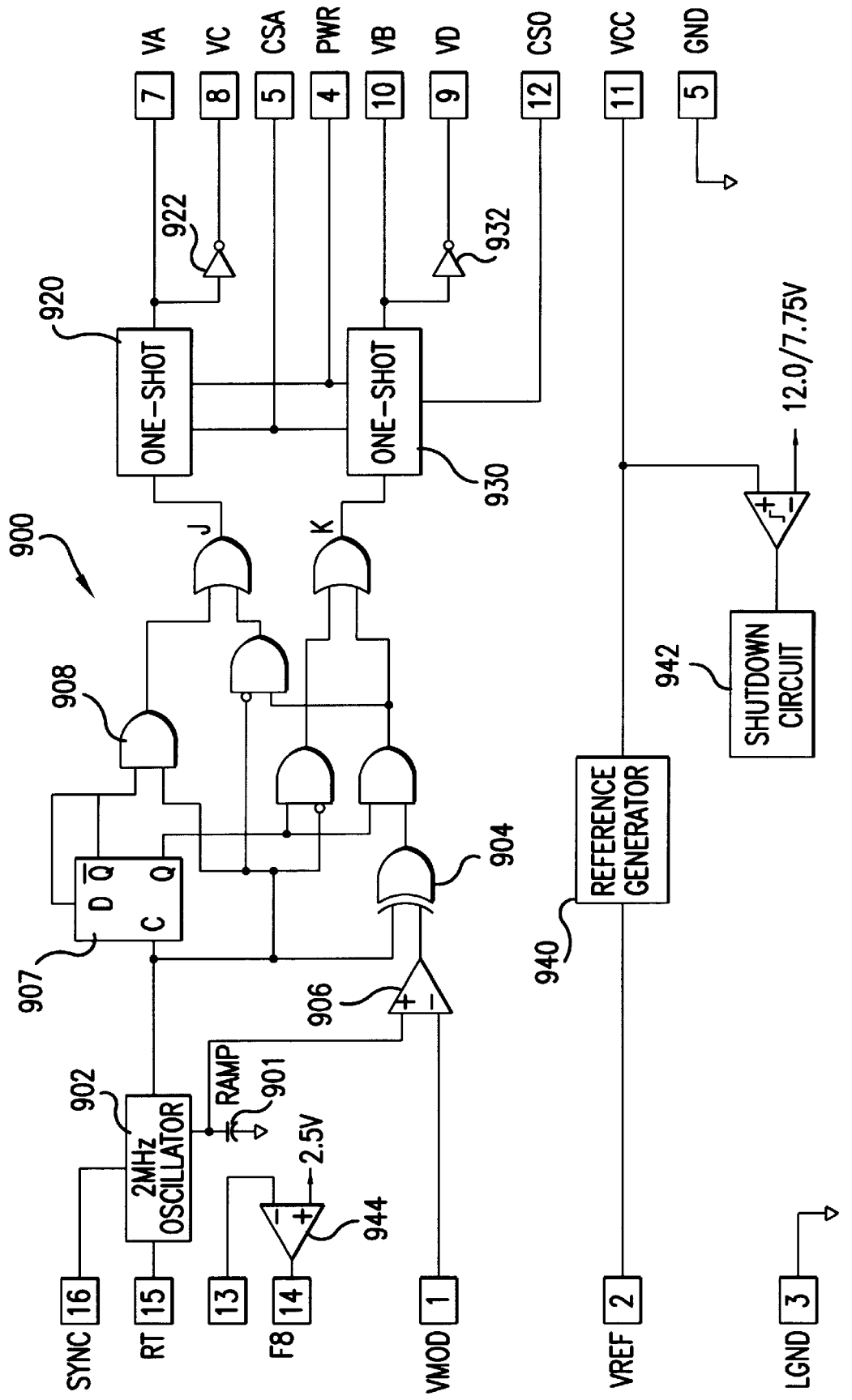
FIG. 13 is a block diagram of the U1 integrated circuit shown in FIGS. 11A and 11B.
Figure 14A:
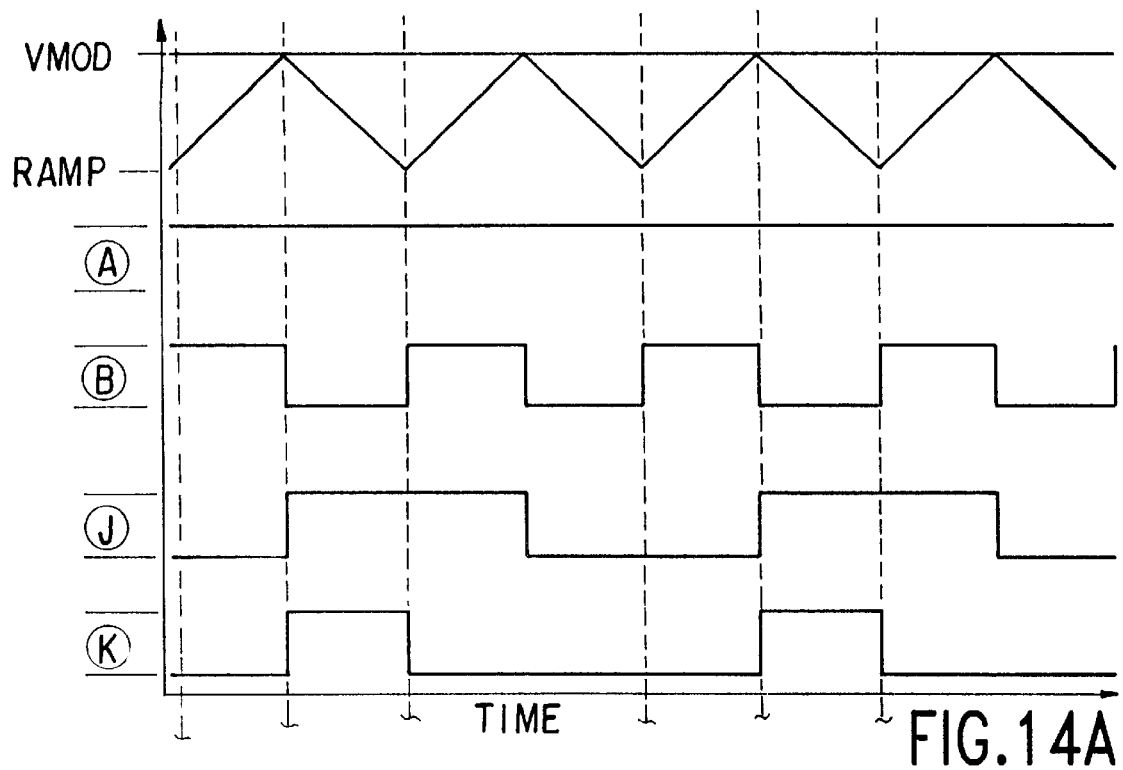
FIGS. 14A and 14B are timing diagrams for the block diagram shown in FIG. 13.
Figure 14B:
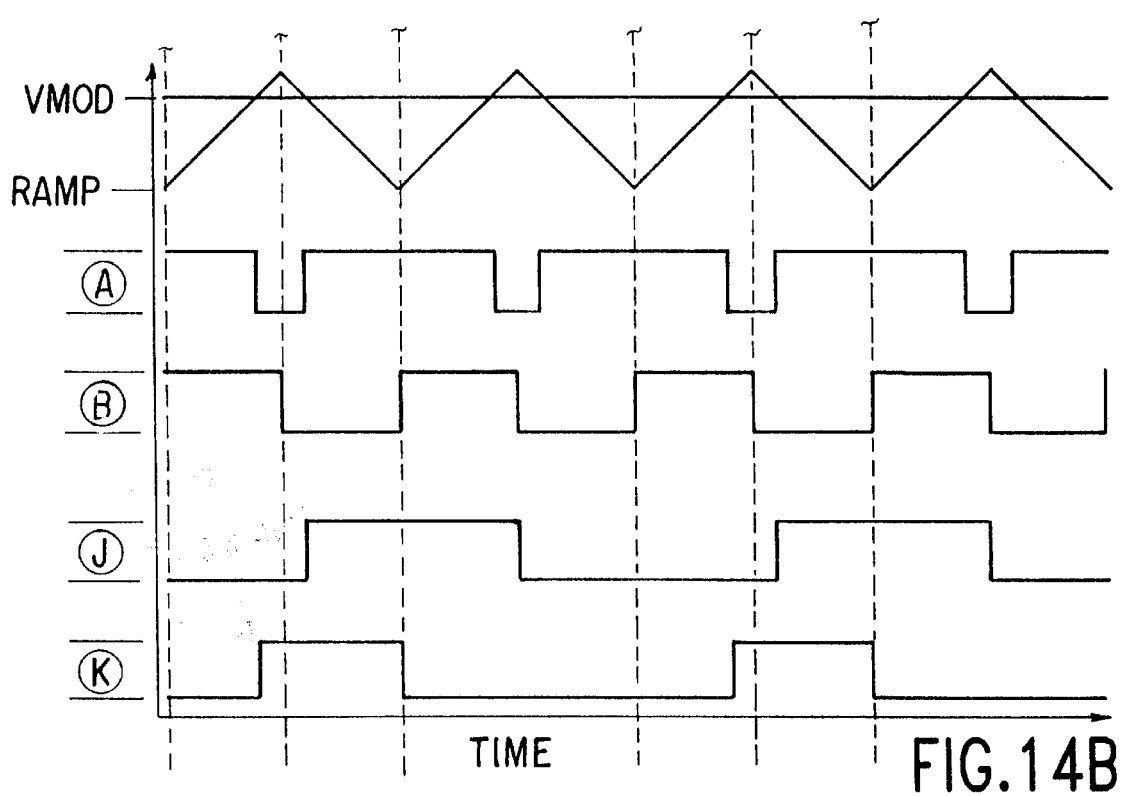

FIG. 13 shows a block diagram 900 of the controller integrated circuit U1. Pins 13, 14, and 15 cooperate together along with external components R3, R4, R5 and R6 to set the operational frequency of the oscillator 902 to be preferably at 2 MHZ, although other frequencies may be selected. An output of the oscillator 902 is coupled to an internal capacitor 901 to provide a triangle signal labeled Ramp on FIGS. 14A and 14B while another output of the oscillator 902 is a 2 MHZ square wave coupled to exclusive OR gate 904 and the clock input of a D flip flop 907. A Schmitt trigger comparator 906 compares the feedback signal VMOD at pin 1 with the ramp signal as is shown in FIGS. 14A and 14B. In FIG. 14A, the VMOD signal, which is the envelope of the feedback signal from the feedback transformer 850 is at the maximum level, while in FIG. 14B, the VMOD signal is somewhat less than the maximum. As can be seen in FIGS. 14A and 14B, the comparator 906 cooperates with the D flip flop 907, the exclusive OR gate 904, and the associated logic gates 908 to generate one shot control signals J and K. As can be seen by comparing FIGS. 14A, when VMOD is at a maximum, the one shot drive signals J and K are controlled so that both one shot control signals go high at the same time. When the amplitude of VMOD drops below the maximum, the timing of the one shot control signal J is retarded and the timing of the one shot control signal K is advanced. These one shot control signals J and K are provided to one shot circuits 920 and 930 within the controller circuit U1, which have dual outputs VA and VC and VB and VD respectively. The one shots 920 and 930 trigger on the rising edge of signals J and K respectively, and the durations to the falling edge of the control signals J and K are irrelevant provided that they fall before the one shots need to be retriggered. Due to the inclusion of inverters 922 and 932, the output pair of signals VA and VC and VB and VD are approximately one hundred and eighty degrees out of phase. It should also be noted that the external capacitor C7 and resistor R7 are coupled to pins 5 and 4 of the controller U1 to control the duration of the output pulses at the one shot 920 and the one shot 930 to trigger them for the same duration. Further, these component values are selected to be as near as possible to provide a fifty percent duty cycle on the outputs L through O of the MOSFET driver circuit U2 at the frequency of operation.

The controller circuit U1 also includes a reference voltage generator 940 that provides the reference voltage for the over voltage protection circuit 942 and the comparator 944. As shown in FIG. 11, an over voltage protection circuit 830 having a coil 832 is located at or near the summing node of the E block core 822. The value of the components within over voltage protection circuit 830 are selected such that if the output voltage DC Output goes above a predetermined threshold, silicon controlled rectifier (SCR) Q3 will fire, shunting the Vbias to ground. This will cause the integrated circuits U1 and U2 to cease operating, thereby shutting down the output until the unit is recycled by temporarily removing the AC input voltage.

Thus, a small, highly efficient form factor power supply has been disclosed that may be readily mounted within a small container having a thickness of 0.436 inches or less and having dimensions suitable for holding in a typical shirt pocket or calculator pocket in a brief case at high power levels of up to about 75 watts DC output with a surface temperature of about 140 degrees Fahrenheit at the surface. Thicknesses of less than 0.436 inches may be attainable if thinner electrolytic or other types of filtering capacitors can be obtained using standard production techniques. Alternatively, a thinner case may be obtained by maximizing coupling of heat generating components to the heat sinks with maximum air flow through the openings defined by the louvers 302 and by making the top and bottom surface areas of the case larger. Regulation of the output voltage may be readily attained. Still further, the secondary coil can be positioned where the magnetic flux induced in the core from the two primary coils destructively interfere with each other and where the phase of the two driving signals is approximately one hundred eighty degrees out of phase at maximum output. In further alternatives, cooling methods other may be used, such as small electric fans, thermal-electric coolers or the like, to permit smaller form factor power supply configurations. Other alternatives will be readily apparent to those of skill in the art. It should be noted that in alternative embodiments, the various resistors, capacitors, frequencies and inductors may be different and other types of integrated circuits may also be used.

FIGS. 16–20 illustrate an improved transformer core 1010 in accordance with an embodiment of the present invention. FIG. 16A shows a top plan view of the transformer core 1010, which is formed by a base plate 1012, a secondary leg 1014 and a pair of primary legs 1016 and 1018. The secondary leg 1014 and the primary legs of the transformer 1010 may be bosses attached to the base plate 1012 by welds, magnetically permeable adhesives, or the like, or the entire assembly may be molded using magnetically permeable powder. FIG. 16B and 16C show two side plan views of how the transformer legs 1014, 1016, and 1018 are positioned on the base plate. FIG. 17A shows a top plan view of a transformer cap 1020, which is secured to the legs 1014, 1016, and 1018 of the transformer core 1010 to complete the transformer core once the bosses have been inserted through cutouts. The transformer legs 1014, 1016, and 1018 are secured to the transformer cap 1020 by magnetically permeable adhesives, welding or the like. FIGS. 17B and 17C show side plan views of the transformer cap 1020.

In preferred embodiments, the transformer core 1010 and transformer cap 1020 are formed from a ferrite material. The operational frequency range of the core is from about 0.5 to 1.0 MHZ. Also, the initial magnetic permeability is preferably 1400±20%. In addition, the saturation flux density may be 5300 gauss, and the Curie temperature may be 250 degrees Centigrade. The core loss while operating at a frequency of 1 MHZ should preferably be approximately 500 KW/m at 500 gauss. In other embodiments, different core parameters may be used.

Figure 16A:
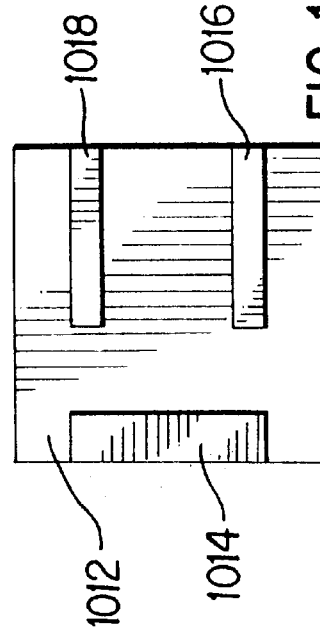
FIGS. 16A–16C are a top plan view and two side plan views of a transformer core in accordance with another embodiment of the power supply.
Figure 16B:
Figure 16C:

In the disclosed embodiments, the base plate 1012 and the transformer cap are dimensioned to be 1.260×1.260×0.075 inches. The secondary transformer leg 1014 is dimensioned to be 0.800×0.200 by 0.060 inches, and each primary transformer leg is 0.133×0.700×0.060 inches. The secondary transformer leg 1014 is positioned away from the primary transformer legs 1016 and 1018, as shown in FIGS. 16A–16C, to maximize the cross-sectional area of each of the transformer legs (i.e., the length and width of the transformer legs). This maximizes a ratio of the cross-sectional area of the transformer legs to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary to the primary windings at a constant value. However, in alternative embodiments, slightly different dimensions for the core parts may be used. Also, as described in the previous embodiments, the secondary coil is still positioned at a summing point of the primary coils.

Figure 18:
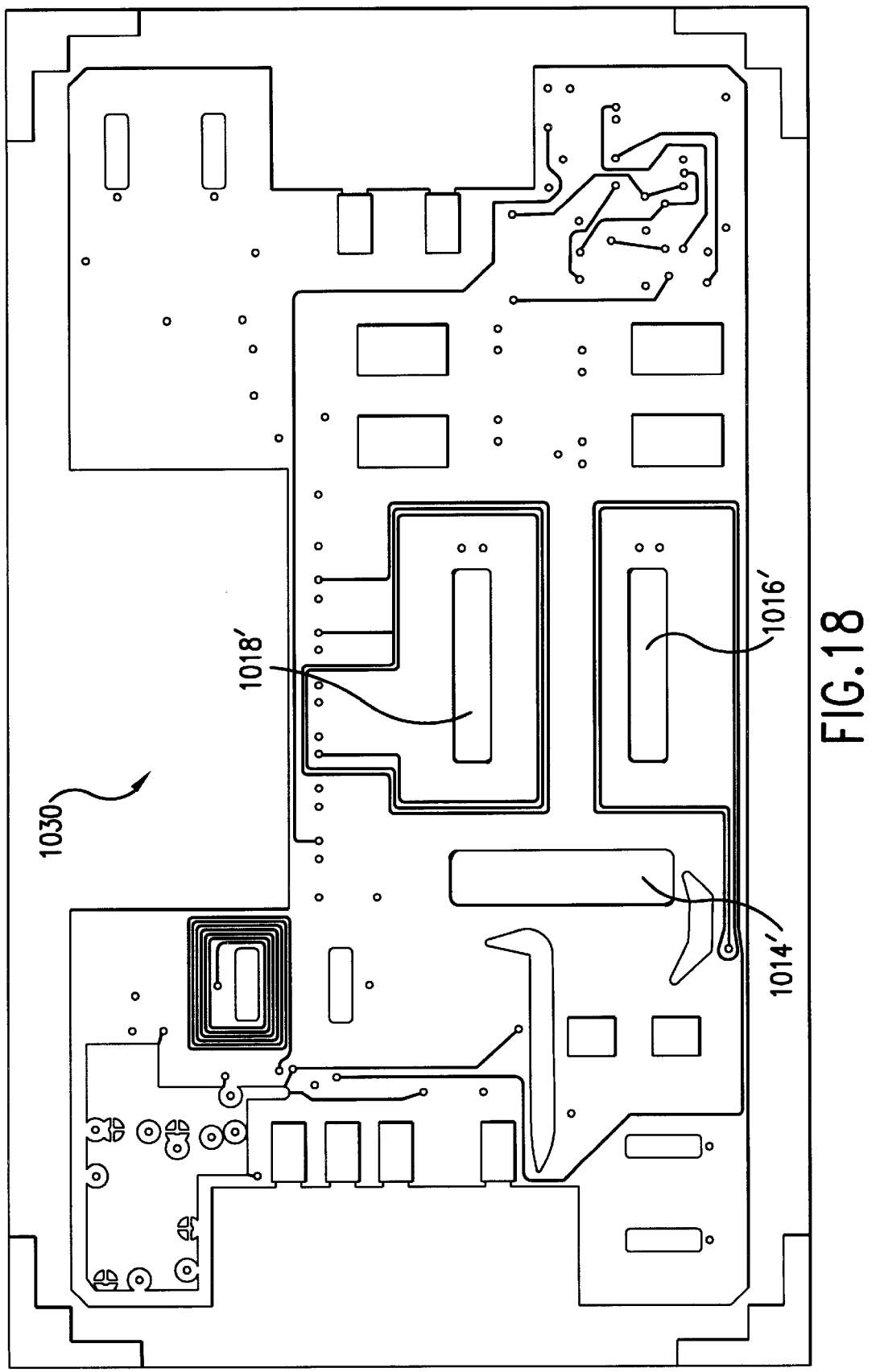
FIG. 18 is a top plan view of a printed circuit board layer, without winding patterns, to be coupled with the transformer core shown in FIGS. 16A–16C.
Figure 19:
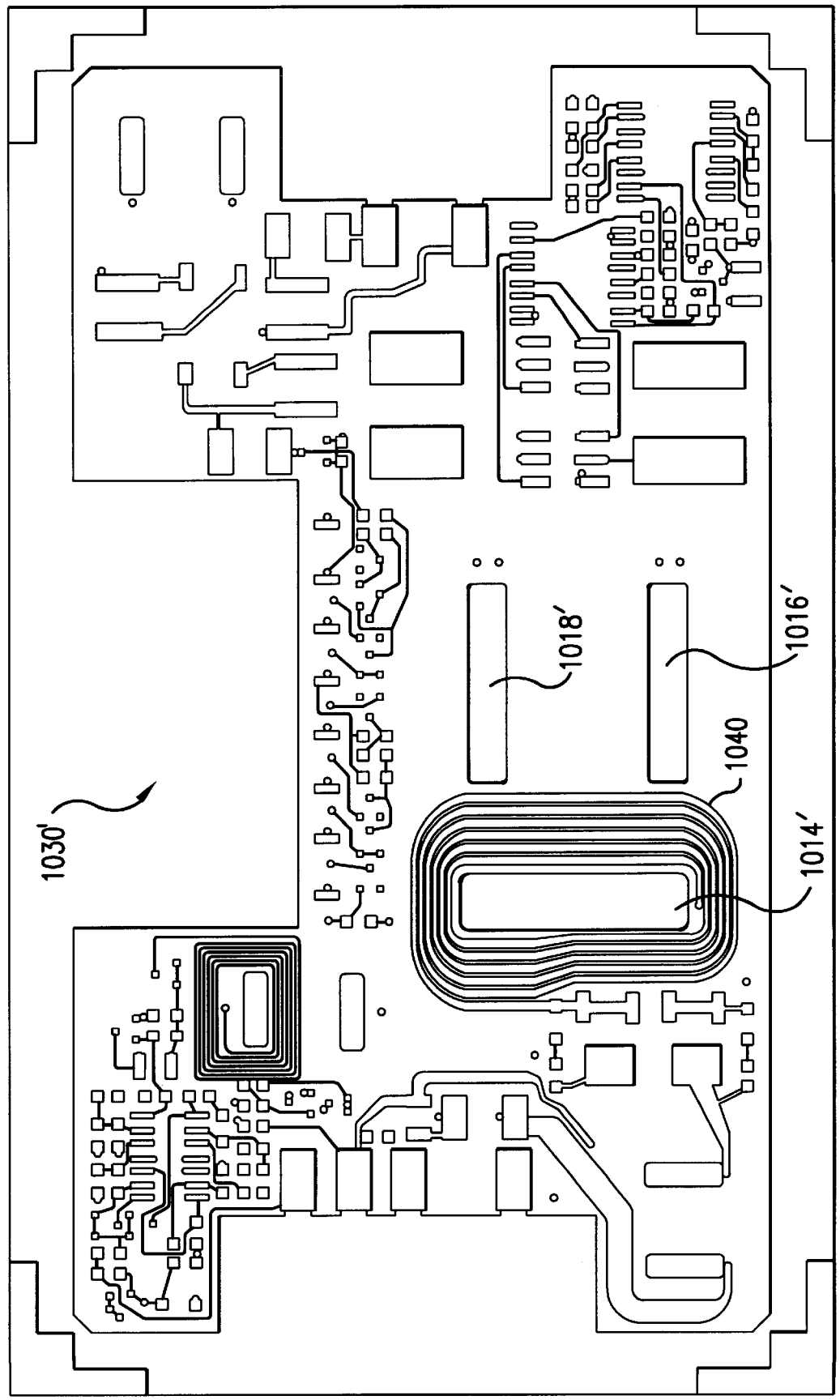
FIG. 19 is a top plan view of another printed circuit board layer showing a secondary winding pattern to be coupled with to the transformer core shown in FIGS. 16A–16C.

FIG. 18 shows a printed circuit card layer 1030 without secondary or primary cores attached and having cutouts 1014', 1016' and 1018' to allow the corresponding transformer legs 1014, 1016 and 1018 to pass through the printed circuit board. FIG. 19 shows another printed circuit card layer 1030" in which a secondary coil pattern 1040 surrounding the cut-out 1014' for the secondary transformer leg 1014. FIG. 16 shows still another printed circuit card layer 1030' in which primary coil patterns 1042 and 1044 surround the cut-outs 1016' and 1018' for the to primary trnsformer legs 1016 and 1018, respectively.

FIGS. 21–26 illustrate an alternative embodiment using two transformer cores 1110 in accordance with the present invention. FIG. 21A shows a top plan view of bottom portion of the transformer core 1110, which is formed by a base plate 1112, a central leg 1114 and a pair of peripheral legs 1116 and 1118. The central leg 1114 and the peripheral legs of the transformer 1110 may be bosses attached to the base plate 1112 by welds, magnetically permeable adhesives, or the like, or the entire assembly may be molded using magnetically permeable powder. FIGS. 21B and 21C show two side plan views of how the transformer legs 1114, 1116, and 1118 are positioned on the base plate 1112. FIG. 22A shows a top plan view of a transformer cap 1120, which is secured to the legs 1114, 1116, and 1118 of the transformer core 1110 to complete the transformer core once the bosses have been inserted through cutouts. The transformer legs 1114, 1116, and 1118 are secured to the transformer cap 1120 by magnetically permeable adhesives, welds or the like. FIGS. 22B and 22C show side plan views of the transformer cap 1120.

In preferred embodiments, the transformer core 1110 and transformer cap 1120 are formed from a ferrite material that has properties and characteristics that are similar to those of the embodiment with the transformer core 1010, discussed-above.

In the disclosed embodiments, the base plate 1112 and the transformer cap 1120 are dimensioned to be 1.113×1.113×0.075 inches. The central transformer leg 1114 is dimensioned to be 0.300×0.300 by 0.060 inches, and each peripheral transformer leg is 0.075×0.630×0.060 inches. The central transformer leg 1114 is positioned away from the peripheral transformer legs 1116 and 1118, as shown in FIGS. 21A–21C, to maximize the cross-sectional area of the central transformer leg 1114 (i.e., the length and width of the central transformer leg). This maximizes a ratio of the cross-sectional area of the central transformer leg 1114 to the windings, thereby requiring less windings for the same magnetic coupling. Fewer windings mean less area of a layer of a circuit board may be used so that the number of layers on the circuit board may be minimized. The improved transformer core also provides this maximized ratio while maintaining the ratio of the secondary to the primary windings at a constant value. Also, as described in the previous transformer core 1010 embodiment, the secondary coil is still positioned at a summing point of the primary coils.

Figure 20:
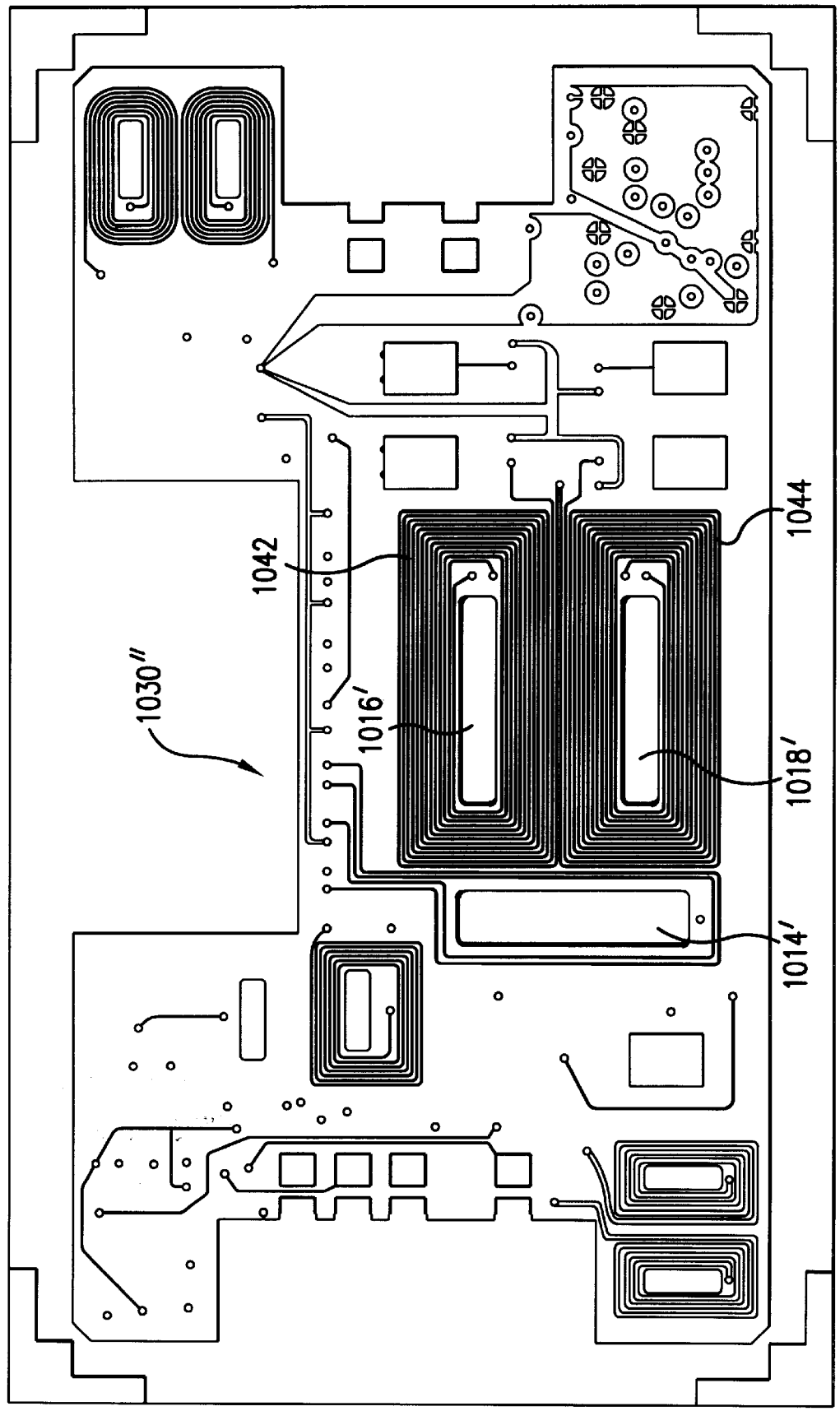
FIG. 20 is a top plan view of another printed circuit board layer showing a primary winding pattern to be coupled with the transformer core shown in FIGS. 16A–16C.
Figure 23:
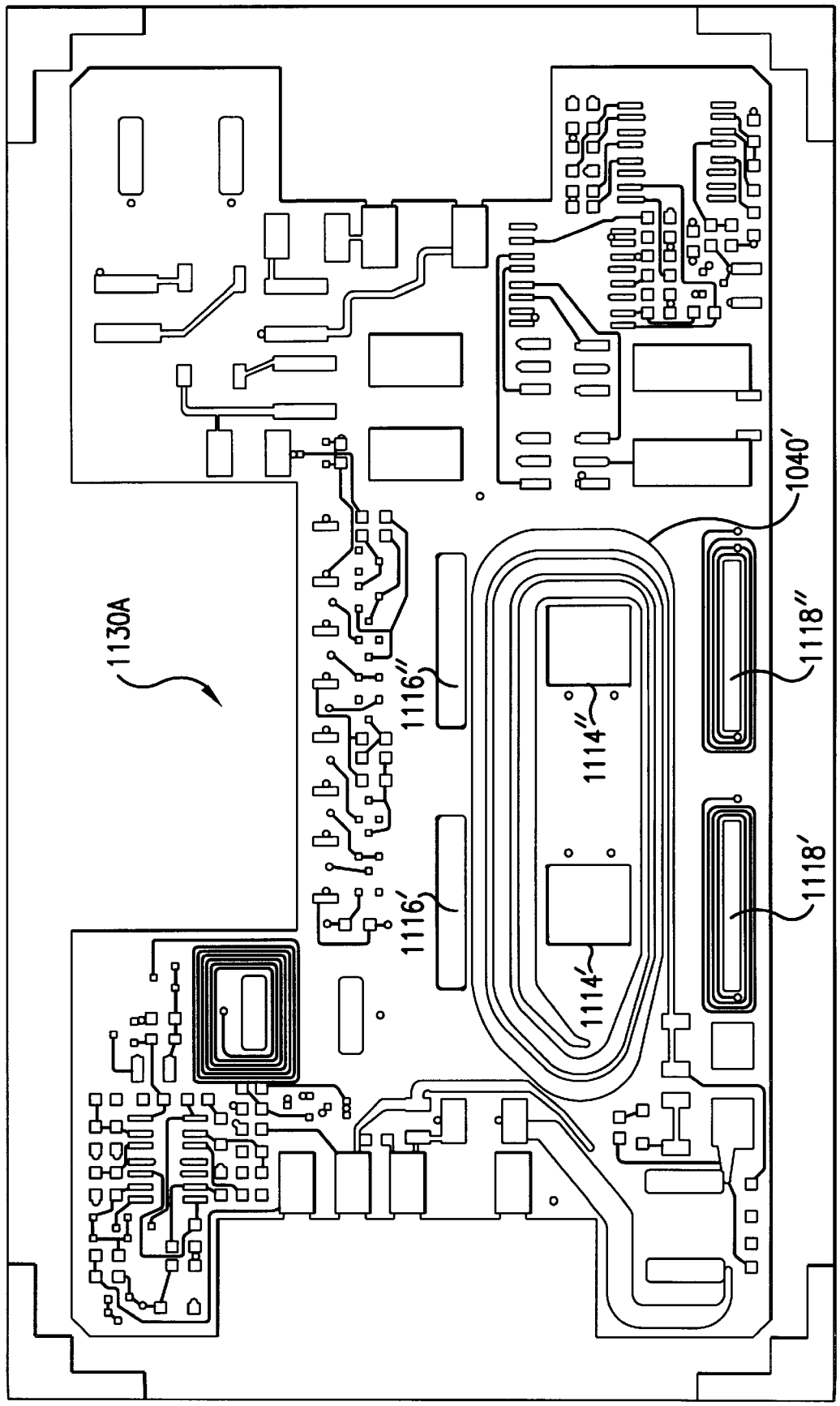
FIG. 23 is a top plan view of a printed circuit board layer with a secondary winding pattern to be coupled with the transformer core shown in FIGS. 21A–21C.
Figure 24:
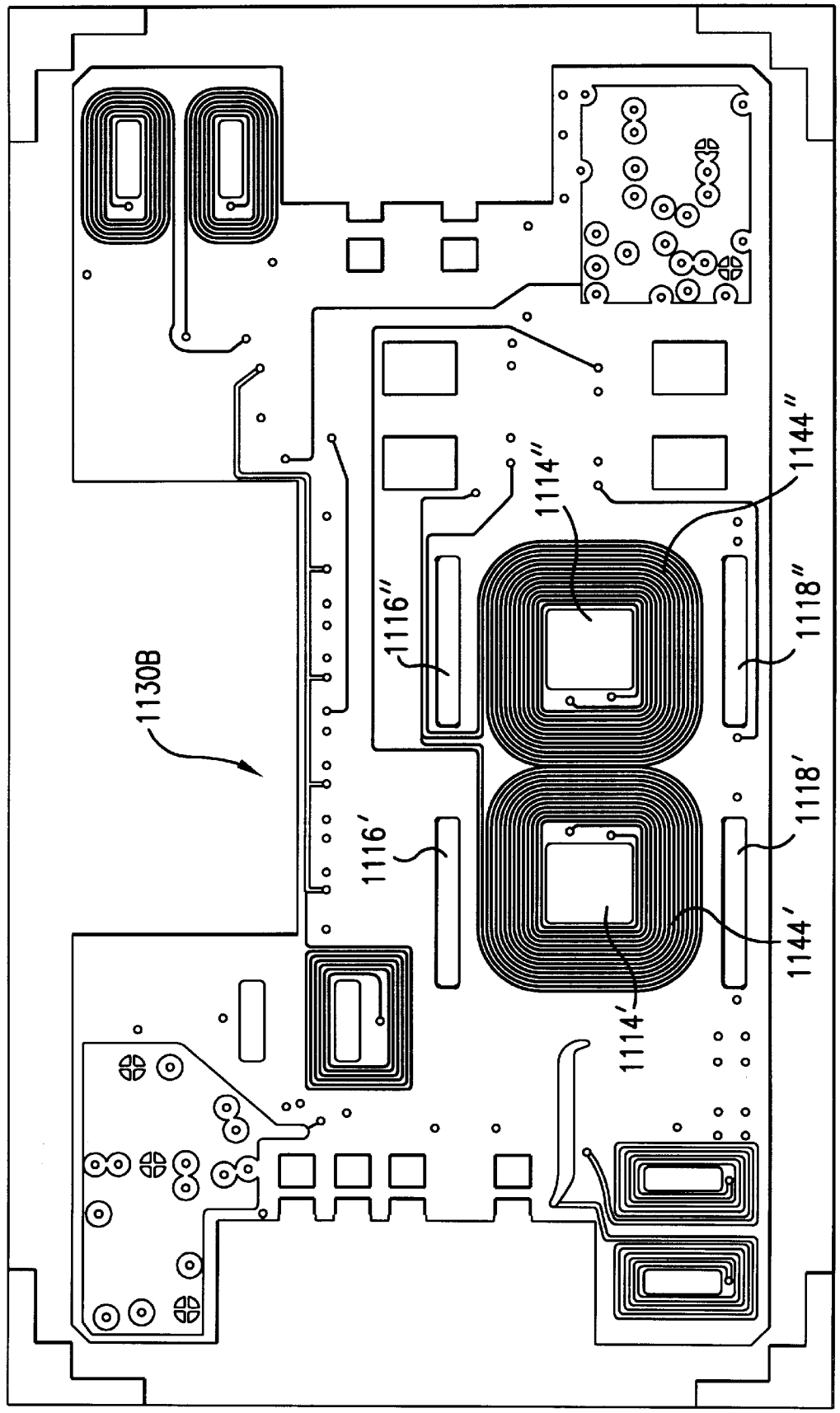
FIG. 24 is a top plan view of another printed circuit board layer showing primary winding patterns to be coupled with the transformer core shown in FIGS. 21A–21C.
Figure 25:
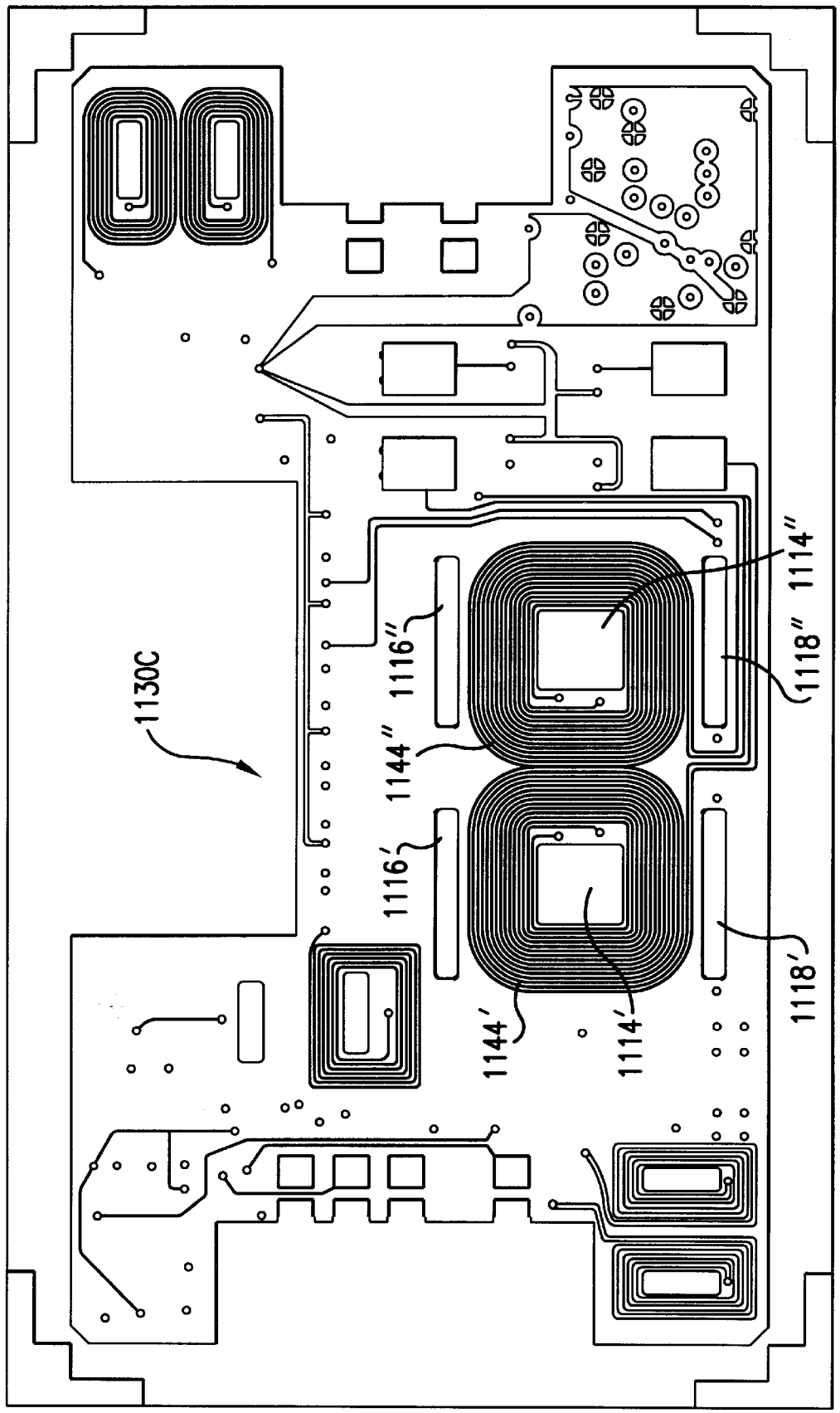
FIG. 25 is a top plan view of another printed circuit board layer showing additional primary winding patterns to be coupled with the transformer core shown in FIGS. 21A–21C.
Figure 26:
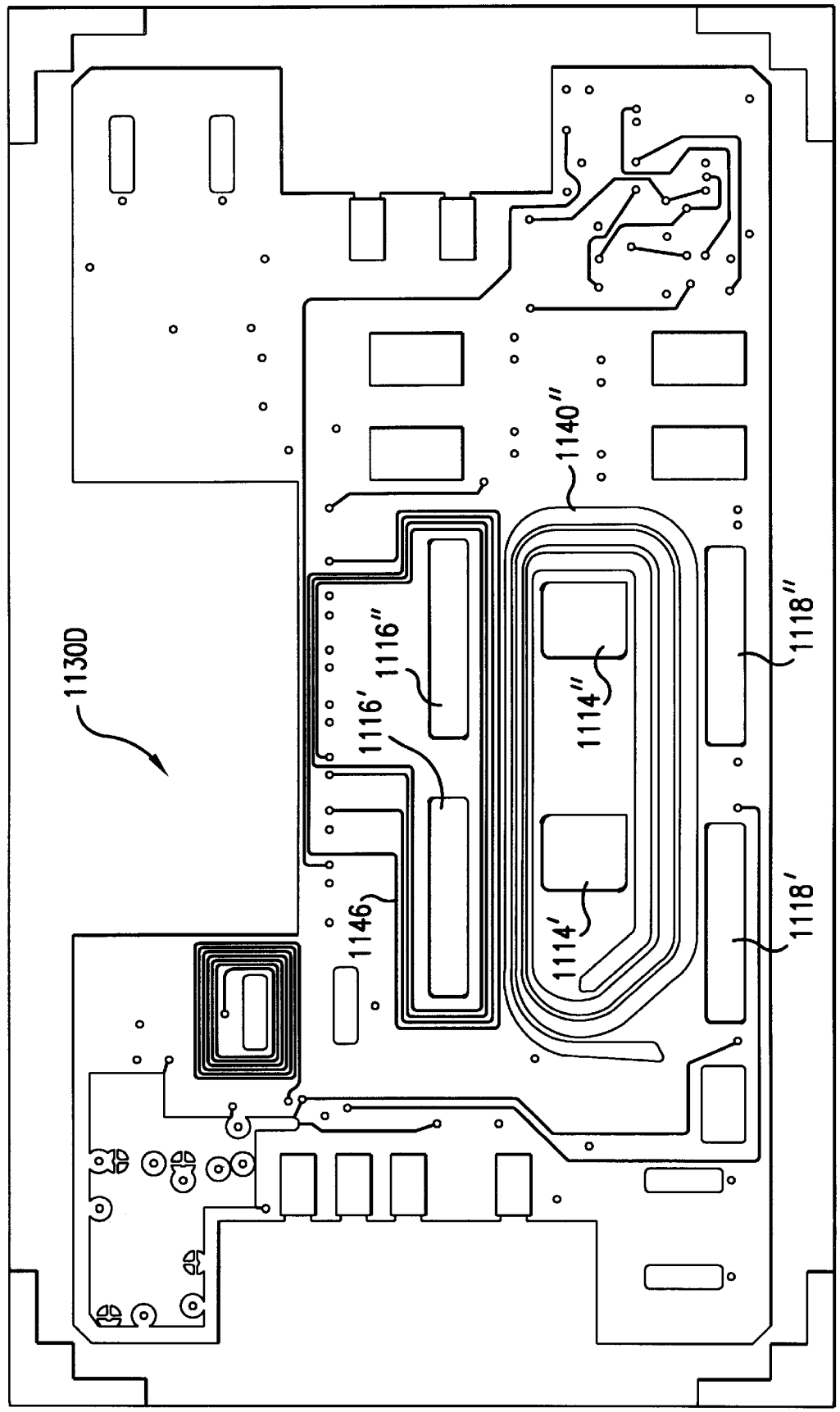
FIG. 26 is a top plan view of another printed circuit board layer showing a another secondary winding pattern to be coupled with the transformer core shown in FIGS. 21A–21C.

FIG. 23 shows a printed circuit card layer 1130A defining a secondary coil 1040' and having cutouts 1114', 1116' and 1118' and cutouts 1114", 1116" and 1118" to allow the corresponding transformer legs 1114, 1116 and 1118 of two transformer cores 1110 to pass through the printed circuit board. The secondary coil pattern 1140' passes around both central leg cutouts 1114' and 1114" to magnetically couple the secondary coil pattern 1040' with the summing point of two primary coils (see FIGS. 24 and 25). FIG. 20 shows another layer 1130B of the printed circuit card in which two primary coil patterns 1142' and 1142" surround the corresponding central cutout 1114' and 1114", respectively. FIG. 25 shows another printed circuit card layer 1130C in which two additional primary coil patterns 1144' and 1144" surround the corresponding central cutout 1114' and 1114", respectively. It should be noted that primary coil patterns 1144' and 1144" are coupled to corresponding primary coil patterns 1142' and 1142" to form the two primary coils that drive the secondary coil. FIG. 26 shows still another printed circuit card layer 1130D in which a secondary coil pattern 1140" surrounds the corresponding central cut-out 1114' and 1114", respectively. It should be noted that secondary coil pattern 1140' is coupled to the corresponding secondary coil pattern 1140" to form the secondary coil that is coupled to the primary coils. Finally, it should be pointed out that the ancillary coil patterns 1146 surrounding the peripheral legs 1116' and 1116" are provided to produce a signal useful for protecting the circuit from over voltage.

Figure 15:
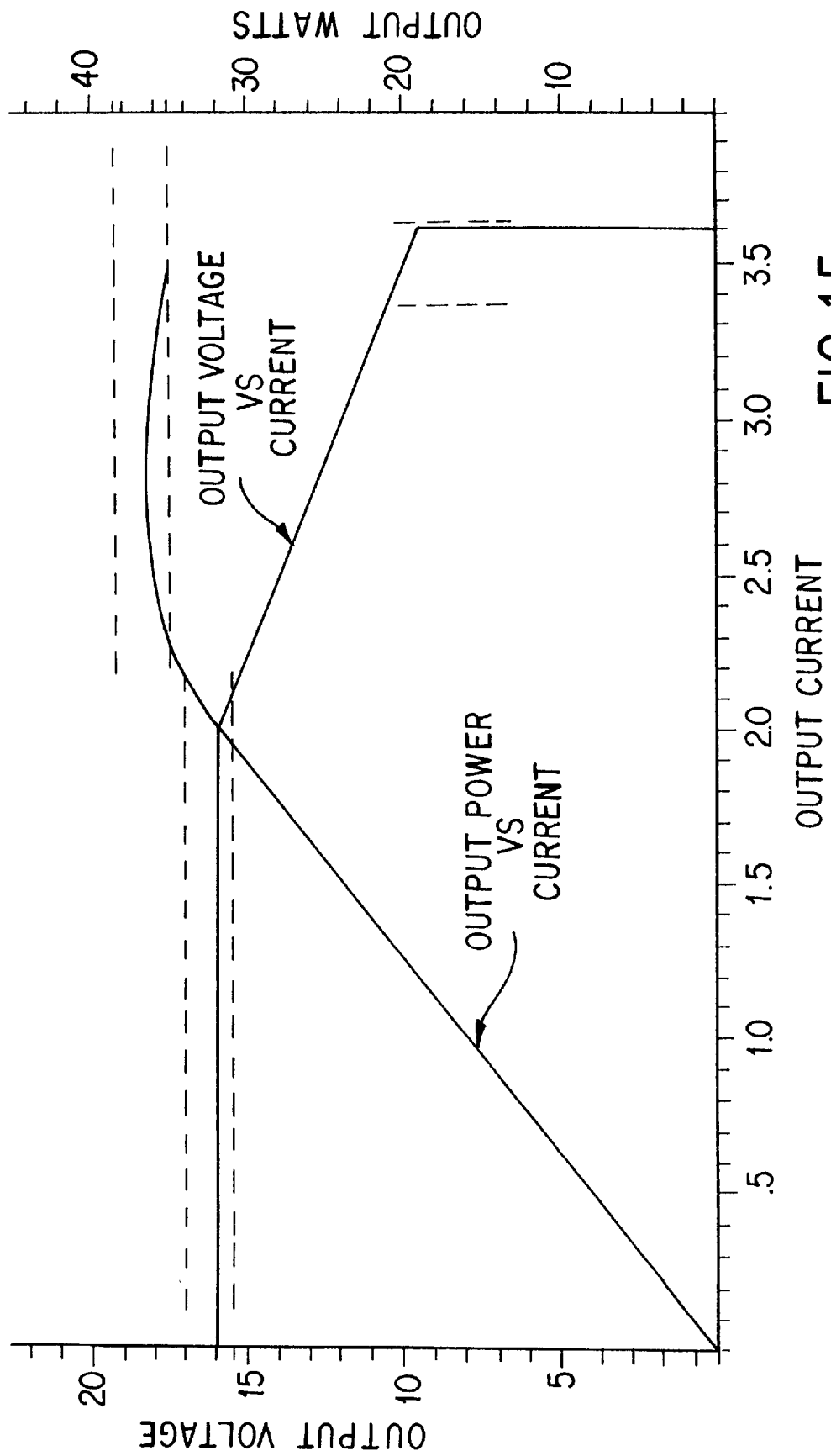
FIG. 15 is a power versus output current curve and an output voltage versus current curve of a power supply in accordance with an embodiment of the power supply of FIG. 1.
Figure 17A:
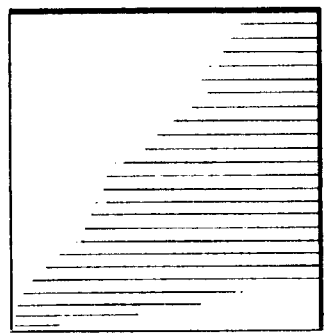
FIGS. 17A–17C are a top plan view and two side plan views of a transformer cap for use with the transformer core shown in FIGS. 16A–16C.
Figure 17B:
Figure 17C:

The applicant has found that this characteristic power and current curve provides good charging of lithium ion, nickel metal hydride, nickel cadmium and other rechargeable batteries. Thus, the small form factor power supply is capable of supplying sufficient power to a personal computer or the like, even when the batteries are thoroughly discharged. The constant current at the output connectors 846, 848 can provide minimal voltages down to about less than one volt because the controller U1 can attain relative phase shifts between the drive signal pairs to between about one degree to one hundred eighty degrees (i.e., signal N lags signal L between about one degree to one hundred eighty degrees and signal O and lags signal M between about one degree and one hundred eighty degrees). Thus, as shown in FIG. 15, if one were to draw a power versus output current curve and an output voltage versus output current curve of such a power supply, the slope of the output voltage curve is relatively constant until the output current reaches approximately 2.0 amperes, then slopes down to 10 volts at which time the output current is essentially constant at approximately 3.6 amperes for voltages under 10 volts. The output power curve increases relatively linearly until the current level reaches approximately 2.2 amperes, at which time the output power curve tends to level off until the current reaches it maximum value of approximately 3.6 amperes. Therefore, the power supply is capable of providing constant current to the personal computer or the like, even if the battery is only capable of producing a fraction of a volt. This power curve is determined as a result of the selected amplifier configuration associated with integrated circuit U3, which may be an LM324 on the secondary side 826. The predetermined limit may be as high as 75 watts DC for a power supply having an upper and lower surface area within the case 300 of about 14 square inches and a thickness of about 0.436 inches or less so that the ratio of the top or bottom surface areas to the thickness is about 30:1.

However, the circuit can readily be programmed to provide other power/current characteristics, such as the power characteristics for lap top computers, appliances, cellular or portable telephones, notebook computers, game systems or the like. This may be accomplished by coupling additional resistors to ground and/or +5 volts (generated by a voltage regulator U4) to the current control and voltage control inputs. The small form factor power supplies described above are capable of charging various different types of batteries, such as NiCad and NiH. However, in alternative embodiments, the small form factor power supplies may charge batteries using Zinc air, Lead acid, alkaline or the like. The power supply may also be used to charge Lithium ion batteries, although a different control chip or circuitry may be required to handle the unique charging requirements of these batteries.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a portable appliance having an operational load, a rechargeable battery, the rechargeable battery having at least one battery cell, a positive terminal and a negative terminal, and a connection adapted to mate with an external power supply, the improvement comprising:

a circuit for generating a signal representative of a voltage between the positive and negative terminals; and a circuit for providing a signal to the connection in response to the signal representative of the voltage for programming the external power supply to provide a desired level of current to the connection.

2. The portable appliance of claim 1, the portable appliance further including a circuit for applying at least a portion of the desired level of current to the positive and negative terminals.

3. The portable appliance of claim 1, the portable appliance further including a circuit for applying a first portion of the desired level of current to the positive and negative terminals and a second portion of the desired level of current to the operating load, wherein the sum of the first and second portions of the desired level of current substantially equals the desired level of current.

4. The portable appliance of claim 1, wherein the at least one battery cell is one of a nickel cadmium battery cell and a lithium ion battery cell.

5. The portable appliance of claim 1, wherein the circuit providing the signal to the connection controls the power supply to provide the desired level of current so as to maintain the voltage between the positive and negative terminal within a set range to achieve optimum charging characteristics for the rechargeable battery.

6. A portable appliance, the portable appliance comprising:

a dynamic operational load;

a rechargeable battery;

a connection adapted for mating with an external power supply for providing a current; and a circuit for providing a signal to the connection for programming the external power supply to provide a current to the connection for recharging the rechargeable battery and powering the dynamic operational load.

7. The portable appliance of claim 6, wherein the rechargeable battery is one of a nickel cadmium battery and a lithium ion battery.

8. The portable appliance of claim 6, wherein the circuit providing the signal to the connection controls the power supply to provide the current to the connection so as to maintain the voltage between the positive and negative terminal within a set range to achieve optimum charging characteristics for the rechargeable battery.

9. A rechargeable battery cartridge adapted to be removably installed in or coupled to a portable appliance, the battery cartridge comprising:

a casing including a first set of terminals adapted for mating with conductors of the portable appliance and a second set of terminals adapted to be coupled to an external power supply;

a rechargeable battery disposed within the casing, the rechargeable battery having a positive terminal and a negative terminal and at least one battery cell for storing a charge between the positive terminal and the negative terminal; and a circuit disposed within the casing for generating a signal to program the external power supply to provide one of a desired current and a desired voltage to be applied to the second set of terminals based upon a voltage between the positive and negative terminals.

10. The rechargeable battery cartridge of claim 9, the rechargeable battery cartridge further including:

a circuit for generating a signal representative of an optimal battery current based upon the voltage between the positive and negative terminals;

a circuit for estimating a current applied to the rechargeable battery;

a circuit for generating a signal representative of a difference between the estimated current and the optimal battery current; and a circuit for providing the signal representative of the difference to the second set of terminals to program the power supply to provide the desired current.

11. The rechargeable battery cartridge of claim 9, the rechargeable battery cartridge further comprising:

a circuit disposed within the casing for generating a signal representative of a current through the rechargeable battery; and a circuit disposed within the casing for providing a signal to one of the terminals of the second set of terminals which representative of a comparison of the signal representative of the current through the rechargeable battery and a signal representative of the desired current through the rechargeable battery.

12. The rechargeable battery cartridge of claim 10, wherein the desired current substantially equals the sum of the optimal battery current and a current applied to a dynamic operational load in the portable appliance.

13. The rechargeable battery cartridge of claim 10, wherein the rechargeable battery is one of a nickel cadmium battery and a lithium ion battery.

14. The rechargeable battery cartridge of claim 10, wherein the circuit for generating the signal to program the external power supply controls the power supply to provide the desired current so as to maintain the voltage between the positive and negative terminal within a set range to achieve optimum charging characteristics for the rechargeable battery.

15. A method of powering a portable appliance, the method comprising:

coupling a rechargeable battery cartridge to the portable appliance, the rechargeable battery cartridge including a rechargeable battery having a positive terminal and a negative terminal and at least one battery cell for storing a charge between the positive terminal and the negative terminal;

coupling an external power supply to a connector of the rechargeable battery cartridge; and providing a signal to the connector of the rechargeable battery to program the external power supply to provide one of a desired level of current to be applied to the connector of the rechargeable battery cartridge based upon a voltage between the positive and negative terminals.

16. The method of claim 15, the method further including applying at least a portion of the desired level of current to the positive and negative terminals.

17. The method of claim 15, the method further including applying a first portion of the desired level of current to the positive and negative terminals and a second portion of the desired level of current to the operating load, wherein the sum of the first and second portions of the desired level of current substantially equals the desired level of current.

18. The method of claim 15, the method further including controlling the power supply to provide the desired level of current so as to maintain the voltage between the positive and negative terminal within a set range to achieve optimum charging characteristics for the rechargeable battery.

* * * * *